United States Patent
Lung et al.

(10) Patent No.: US 8,310,864 B2
(45) Date of Patent: *Nov. 13, 2012

(54) SELF-ALIGNED BIT LINE UNDER WORD LINE MEMORY ARRAY

(75) Inventors: Hsiang-Lan Lung, Dobbs Ferry, NY (US); Chung H Lam, Peekskill, NY (US); Erh-Kun Lai, Elmsford, NY (US); Matthew J. Breitwisch, Yorktown Heights, NY (US)

(73) Assignees: Macronix International Co., Ltd., Hsinchu (TW); International Business Machines Corporation, Armonk, NY (US)

( * ) Notice: Subject to any disclaimer, the term of this patent is extended or adjusted under 35 U.S.C. 154(b) by 276 days.

This patent is subject to a terminal disclaimer.

(21) Appl. No.: 12/815,680

(22) Filed: Jun. 15, 2010

(65) Prior Publication Data
US 2011/0305074 A1 Dec. 15, 2011

(51) Int. Cl.
*G11C 11/00* (2006.01)
(52) U.S. Cl. ............ 365/163; 365/46; 365/55; 365/74; 365/97; 365/100; 365/131; 365/148; 365/158; 365/171
(58) Field of Classification Search .............. 365/46, 365/55, 74, 97, 100, 131, 148, 158, 171, 365/173, 163, 51, 63, 69, 72; 438/128; 257/5, 257/E21.602, E45.001
See application file for complete search history.

(56) References Cited

U.S. PATENT DOCUMENTS

| | | | |
|---|---|---|---|
| 3,271,591 A | 9/1966 | Ovshinsky |
| 3,530,441 A | 9/1970 | Ovshinsky |
| 3,846,767 A | 11/1974 | Cohen |
| 4,452,592 A | 6/1984 | Tsai |
| 4,599,705 A | 7/1986 | Holmberg et al. |
| 4,719,594 A | 1/1988 | Young et al. |
| 4,769,339 A | 9/1988 | Ishii |
| 4,876,220 A | 10/1989 | Mohsen et al. |
| 4,959,812 A | 9/1990 | Momodomi et al. |

(Continued)

FOREIGN PATENT DOCUMENTS
WO 2004025659 A1 3/2004

OTHER PUBLICATIONS

"Magnetic Bit Boost," www.sciencenews.org, Dec. 18 & 25, 2004, p. 389, vol. 166.

(Continued)

*Primary Examiner* — Fernando Hidalgo
(74) *Attorney, Agent, or Firm* — Haynes Beffel & Wolfeld LLP

(57) ABSTRACT

A memory device is described that comprises a plurality of bit lines and an array of vertical transistors arranged on the plurality of bit lines. A plurality of word lines is formed along rows of vertical transistors in the array which comprise thin film sidewalls of word line material and arranged so that the thin film sidewalls merge in the row direction, and do not merge in the column direction, to form word lines. The word lines provide "surrounding gate" structures for embodiments in which the vertical transistors are field effect transistors. Memory elements are formed in electrical communication with the vertical transistors. A fully self-aligned process is provided in which the word lines and memory elements are aligned with the vertical transistors without additional patterning steps.

30 Claims, 17 Drawing Sheets

U.S. PATENT DOCUMENTS

| | | |
|---|---|---|
| 5,106,775 A | 4/1992 | Kaga et al. |
| 5,166,096 A | 11/1992 | Cote et al. |
| 5,166,758 A | 11/1992 | Ovshinsky et al. |
| 5,177,567 A | 1/1993 | Klersy et al. |
| 5,332,923 A | 7/1994 | Takeuchi |
| 5,389,566 A | 2/1995 | Lage |
| 5,391,901 A | 2/1995 | Tanabe |
| 5,515,488 A | 5/1996 | Hoppe et al. |
| 5,534,712 A | 7/1996 | Ovshinsky et al. |
| 5,550,396 A | 8/1996 | Tsutsumi |
| 5,687,112 A | 11/1997 | Ovshinsky |
| 5,688,713 A | 11/1997 | Linliu et al. |
| 5,716,883 A | 2/1998 | Tseng |
| 5,751,012 A | 5/1998 | Wolstenholme et al. |
| 5,754,472 A | 5/1998 | Sim |
| 5,789,277 A | 8/1998 | Zahorik et al. |
| 5,789,758 A | 8/1998 | Reinberg |
| 5,814,527 A | 9/1998 | Wolstenholme et al. |
| 5,831,276 A | 11/1998 | Gonzalez et al. |
| 5,837,564 A | 11/1998 | Sandhu et al. |
| 5,869,843 A | 2/1999 | Harshfield |
| 5,879,955 A | 3/1999 | Gonzalez et al. |
| 5,902,704 A | 5/1999 | Schoenborn et al. |
| 5,920,788 A | 7/1999 | Reinberg |
| 5,933,365 A | 8/1999 | Klersy et al. |
| 5,952,671 A | 9/1999 | Reinberg et al. |
| 5,958,358 A | 9/1999 | Tenne et al. |
| 5,970,336 A | 10/1999 | Wolstenholme et al. |
| 5,985,698 A | 11/1999 | Gonzalez et al. |
| 5,998,244 A | 12/1999 | Wolstenholme et al. |
| 6,011,725 A | 1/2000 | Eitan |
| 6,025,220 A | 2/2000 | Sandhu |
| 6,031,287 A | 2/2000 | Harshfield |
| 6,034,882 A | 3/2000 | Johnson et al. |
| 6,046,951 A | 4/2000 | El Hajji |
| 6,066,870 A | 5/2000 | Siek |
| 6,075,719 A | 6/2000 | Lowrey et al. |
| 6,077,674 A | 6/2000 | Schleifer et al. |
| 6,077,729 A | 6/2000 | Harshfield |
| 6,087,269 A | 7/2000 | Williams |
| 6,087,674 A | 7/2000 | Ovshinsky et al. |
| 6,104,038 A | 8/2000 | Gonzalez et al. |
| 6,111,264 A | 8/2000 | Wolstenholme et al. |
| 6,114,713 A | 9/2000 | Zahorik |
| 6,117,720 A | 9/2000 | Harshfield |
| 6,147,395 A | 11/2000 | Gilgen |
| 6,150,253 A | 11/2000 | Doan et al. |
| 6,153,890 A | 11/2000 | Wolstenholme et al. |
| 6,177,317 B1 | 1/2001 | Huang et al. |
| 6,185,122 B1 | 2/2001 | Johnson et al. |
| 6,189,582 B1 | 2/2001 | Reinberg et al. |
| 6,236,059 B1 | 5/2001 | Wolstenholme et al. |
| RE37,259 E | 7/2001 | Ovshinsky |
| 6,271,090 B1 | 8/2001 | Huang et al. |
| 6,280,684 B1 | 8/2001 | Yamada et al. |
| 6,287,887 B1 | 9/2001 | Gilgen |
| 6,291,137 B1 | 9/2001 | Lyons et al. |
| 6,314,014 B1 | 11/2001 | Lowrey et al. |
| 6,316,348 B1 | 11/2001 | Fu et al. |
| 6,320,786 B1 | 11/2001 | Chang et al. |
| 6,326,307 B1 | 12/2001 | Lindley et al. |
| 6,337,266 B1 | 1/2002 | Zahorik |
| 6,339,544 B1 | 1/2002 | Chiang et al. |
| 6,351,406 B1 | 2/2002 | Johnson et al. |
| 6,372,651 B1 | 4/2002 | Yang et al. |
| 6,380,068 B2 | 4/2002 | Jeng et al. |
| 6,420,215 B1 | 7/2002 | Knall et al. |
| 6,420,216 B1 | 7/2002 | Clevenger et al. |
| 6,420,725 B1 | 7/2002 | Harshfield |
| 6,423,621 B2 | 7/2002 | Doan et al. |
| 6,429,064 B1 | 8/2002 | Wicker |
| 6,440,837 B1 | 8/2002 | Harshfield |
| 6,462,353 B1 | 10/2002 | Gilgen |
| 6,483,736 B2 | 11/2002 | Johnson et al. |
| 6,487,106 B1 | 11/2002 | Kozicki |
| 6,487,114 B2 | 11/2002 | Jong et al. |
| 6,501,111 B1 | 12/2002 | Lowrey |
| 6,507,061 B1 | 1/2003 | Hudgens et al. |
| 6,511,867 B2 | 1/2003 | Lowrey et al. |
| 6,512,241 B1 | 1/2003 | Lai |
| 6,512,263 B1 | 1/2003 | Yuan et al. |
| 6,514,788 B2 | 2/2003 | Quinn |
| 6,514,820 B2 | 2/2003 | Ahn et al. |
| 6,534,781 B2 | 3/2003 | Dennison |
| 6,545,903 B1 | 4/2003 | Wu |
| 6,551,866 B1 | 4/2003 | Maeda |
| 6,555,858 B1 | 4/2003 | Jones et al. |
| 6,555,860 B2 | 4/2003 | Lowrey et al. |
| 6,563,156 B2 | 5/2003 | Harshfield |
| 6,566,700 B2 | 5/2003 | Xu |
| 6,567,293 B1 | 5/2003 | Lowrey et al. |
| 6,576,546 B2 | 6/2003 | Gilbert et al. |
| 6,579,760 B1 | 6/2003 | Lung |
| 6,586,761 B2 | 7/2003 | Lowrey |
| 6,589,714 B2 | 7/2003 | Maimon et al. |
| 6,593,176 B2 | 7/2003 | Dennison |
| 6,596,589 B2 | 7/2003 | Tseng |
| 6,597,009 B2 | 7/2003 | Wicker |
| 6,605,527 B2 | 8/2003 | Dennison et al. |
| 6,605,821 B1 | 8/2003 | Lee et al. |
| 6,607,974 B2 | 8/2003 | Harshfield |
| 6,613,604 B2 | 9/2003 | Maimon et al. |
| 6,617,192 B1 | 9/2003 | Lowrey et al. |
| 6,621,095 B2 | 9/2003 | Chiang et al. |
| 6,627,530 B2 | 9/2003 | Li et al. |
| 6,639,849 B2 | 10/2003 | Takahashi et al. |
| 6,673,700 B2 | 1/2004 | Dennison et al. |
| 6,674,115 B2 | 1/2004 | Hudgens et al. |
| 6,687,307 B1 | 2/2004 | Anikhindi et al. |
| 6,744,088 B1 | 6/2004 | Dennison |
| 6,750,079 B2 | 6/2004 | Lowrey et al. |
| 6,750,101 B2 | 6/2004 | Lung |
| 6,791,102 B2 | 9/2004 | Johnson et al. |
| 6,797,979 B2 | 9/2004 | Chiang et al. |
| 6,800,504 B2 | 10/2004 | Li et al. |
| 6,800,563 B2 | 10/2004 | Xu |
| 6,815,704 B1 | 11/2004 | Chen |
| 6,838,692 B1 | 1/2005 | Lung |
| 6,850,432 B2 | 2/2005 | Lu et al. |
| 6,859,389 B2 | 2/2005 | Idehara |
| 6,861,267 B2 | 3/2005 | Xu et al. |
| 6,864,500 B2 | 3/2005 | Gilton |
| 6,864,503 B2 | 3/2005 | Lung |
| 6,867,638 B2 | 3/2005 | Saiki et al. |
| 6,881,603 B2 | 4/2005 | Lai |
| 6,888,750 B2 | 5/2005 | Walker et al. |
| 6,894,304 B2 | 5/2005 | Moore |
| 6,894,305 B2 | 5/2005 | Yi et al. |
| 6,897,467 B2 | 5/2005 | Doan et al. |
| 6,900,517 B2 | 5/2005 | Tanaka et al. |
| 6,903,362 B2 | 6/2005 | Wyeth et al. |
| 6,909,107 B2 | 6/2005 | Rodgers et al. |
| 6,910,907 B2 | 6/2005 | Layadi et al. |
| 6,927,410 B2 | 8/2005 | Chen |
| 6,928,022 B2 | 8/2005 | Cho et al. |
| 6,933,516 B2 | 8/2005 | Xu |
| 6,936,544 B2 | 8/2005 | Huang et al. |
| 6,936,840 B2 | 8/2005 | Sun et al. |
| 6,937,507 B2 | 8/2005 | Chen |
| 6,943,365 B2 | 9/2005 | Lowrey et al. |
| 6,969,866 B1 | 11/2005 | Lowrey et al. |
| 6,972,428 B2 | 12/2005 | Maimon |
| 6,972,430 B2 | 12/2005 | Casagrande et al. |
| 6,977,181 B1 | 12/2005 | Raberg |
| 6,992,932 B2 | 1/2006 | Cohen |
| 6,998,289 B2 | 2/2006 | Hudgens et al. |
| 7,018,911 B2 | 3/2006 | Lee et al. |
| 7,023,008 B1 | 4/2006 | Happ |
| 7,023,009 B2 | 4/2006 | Kostylev et al. |
| 7,033,856 B2 | 4/2006 | Lung |
| 7,038,230 B2 | 5/2006 | Chen et al. |
| 7,038,938 B2 | 5/2006 | Kang |
| 7,042,001 B2 | 5/2006 | Kim et al. |
| 7,054,183 B2 | 5/2006 | Rinerson et al. |
| 7,067,837 B2 | 6/2006 | Hwang et al. |
| 7,067,864 B2 | 6/2006 | Nishida et al. |
| 7,067,865 B2 | 6/2006 | Lung |

| | | | | | | |
|---|---|---|---|---|---|---|
| 7,078,273 B2 * | 7/2006 | Matsuoka et al. ............ 438/128 | 2003/0003647 A1 | 1/2003 | Dennison et al. | |
| 7,099,180 B1 | 8/2006 | Dodge et al. | 2003/0072195 A1 | 4/2003 | Mikolajick | |
| 7,115,927 B2 | 10/2006 | Hideki et al. | 2003/0095426 A1 | 5/2003 | Hush et al. | |
| 7,122,281 B2 | 10/2006 | Pierrat | 2003/0116794 A1 | 6/2003 | Lowrey | |
| 7,122,824 B2 | 10/2006 | Khouri et al. | 2003/0186481 A1 | 10/2003 | Lung | |
| 7,126,149 B2 | 10/2006 | Iwasaki et al. | 2003/0215978 A1 | 11/2003 | Maimon et al. | |
| 7,126,847 B2 | 10/2006 | Ha et al. | 2004/0026686 A1 | 2/2004 | Lung | |
| 7,132,675 B2 | 11/2006 | Gilton | 2004/0051094 A1 | 3/2004 | Ooishi | |
| 7,151,273 B2 | 12/2006 | Campbell et al. | 2004/0113137 A1 | 6/2004 | Lowrey | |
| 7,154,774 B2 | 12/2006 | Bedeschi et al. | 2004/0114317 A1 | 6/2004 | Chiang et al. | |
| 7,158,411 B2 | 1/2007 | Yeh et al. | 2004/0165422 A1 | 8/2004 | Hideki et al. | |
| 7,164,147 B2 | 1/2007 | Lee et al. | 2004/0248339 A1 | 12/2004 | Lung | |
| 7,166,533 B2 | 1/2007 | Happ | 2004/0256610 A1 | 12/2004 | Lung | |
| 7,169,635 B2 | 1/2007 | Kozicki | 2005/0018526 A1 | 1/2005 | Lee | |
| 7,202,493 B2 | 4/2007 | Lung | 2005/0019975 A1 | 1/2005 | Lee et al. | |
| 7,208,751 B2 | 4/2007 | Ooishi | 2005/0029502 A1 | 2/2005 | Hudgens | |
| 7,214,958 B2 | 5/2007 | Happ | 2005/0052904 A1 | 3/2005 | Cho et al. | |
| 7,220,983 B2 | 5/2007 | Lung | 2005/0062087 A1 | 3/2005 | Chen et al. | |
| 7,229,883 B2 | 6/2007 | Wang et al. | 2005/0093022 A1 | 5/2005 | Lung | |
| 7,238,959 B2 | 7/2007 | Chen | 2005/0127347 A1 | 6/2005 | Choi et al. | |
| 7,238,994 B2 | 7/2007 | Chen et al. | 2005/0127349 A1 | 6/2005 | Horak et al. | |
| 7,248,494 B2 | 7/2007 | Oh et al. | 2005/0141261 A1 | 6/2005 | Ahn | |
| 7,251,157 B2 | 7/2007 | Osada et al. | 2005/0145984 A1 | 7/2005 | Chen et al. | |
| 7,253,429 B2 | 8/2007 | Klersy et al. | 2005/0167656 A1 | 8/2005 | Sun et al. | |
| 7,254,059 B2 | 8/2007 | Li et al. | 2005/0191804 A1 | 9/2005 | Lai et al. | |
| 7,262,502 B2 | 8/2007 | Chang | 2005/0195633 A1 | 9/2005 | Choi et al. | |
| 7,269,052 B2 | 9/2007 | Segal et al. | 2005/0201182 A1 | 9/2005 | Osada et al. | |
| 7,277,317 B2 | 10/2007 | Le Phan | 2005/0212024 A1 | 9/2005 | Happ | |
| 7,291,556 B2 | 11/2007 | Choi et al. | 2005/0212026 A1 | 9/2005 | Chung et al. | |
| 7,309,630 B2 | 12/2007 | Fan et al. | 2005/0215009 A1 | 9/2005 | Cho | |
| 7,314,776 B2 | 1/2008 | Johnson et al. | 2005/0263829 A1 | 12/2005 | Song et al. | |
| 7,317,201 B2 | 1/2008 | Gutsche et al. | 2006/0001174 A1 | 1/2006 | Matsui | |
| 7,321,130 B2 | 1/2008 | Lung et al. | 2006/0003263 A1 | 1/2006 | Chang | |
| 7,323,708 B2 | 1/2008 | Lee et al. | 2006/0006472 A1 | 1/2006 | Jiang | |
| 7,323,734 B2 | 1/2008 | Ha et al. | 2006/0018156 A1 | 1/2006 | Happ | |
| 7,332,370 B2 | 2/2008 | Chang et al. | 2006/0038221 A1 | 2/2006 | Lee et al. | |
| 7,336,526 B2 | 2/2008 | Osada et al. | 2006/0066156 A1 | 3/2006 | Dong et al. | |
| 7,351,648 B2 | 4/2008 | Furukawa et al. | 2006/0073642 A1 | 4/2006 | Yeh et al. | |
| 7,359,231 B2 | 4/2008 | Venkataraman et al. | 2006/0077741 A1 | 4/2006 | Wang et al. | |
| 7,364,935 B2 | 4/2008 | Lung | 2006/0091476 A1 | 5/2006 | Pinnow et al. | |
| 7,365,385 B2 | 4/2008 | Abbott | 2006/0094154 A1 | 5/2006 | Lung | |
| 7,379,328 B2 | 5/2008 | Osada et al. | 2006/0097301 A1 * | 5/2006 | Wang et al. ............ 257/296 | |
| 7,385,235 B2 | 6/2008 | Lung | 2006/0108667 A1 | 5/2006 | Lung | |
| 7,388,273 B2 | 6/2008 | Burr et al. | 2006/0110878 A1 | 5/2006 | Lung et al. | |
| 7,394,088 B2 | 7/2008 | Lung | 2006/0110888 A1 | 5/2006 | Cho et al. | |
| 7,394,089 B2 | 7/2008 | Doyle et al. | 2006/0113520 A1 | 6/2006 | Yamamoto et al. | |
| 7,397,060 B2 | 7/2008 | Lung | 2006/0113521 A1 | 6/2006 | Lung | |
| 7,400,522 B2 | 7/2008 | Toda et al. | 2006/0118913 A1 | 6/2006 | Yi et al. | |
| 7,423,300 B2 | 9/2008 | Lung et al. | 2006/0124916 A1 | 6/2006 | Lung | |
| 7,426,134 B2 | 9/2008 | Happ et al. | 2006/0126395 A1 | 6/2006 | Chen et al. | |
| 7,440,308 B2 | 10/2008 | Jeong et al. | 2006/0131555 A1 | 6/2006 | Liu et al. | |
| 7,449,710 B2 | 11/2008 | Lung | 2006/0138467 A1 | 6/2006 | Lung | |
| 7,473,576 B2 | 1/2009 | Lung | 2006/0154185 A1 | 7/2006 | Ho et al. | |
| 7,479,649 B2 | 1/2009 | Lung | 2006/0157680 A1 | 7/2006 | Takaura et al. | |
| 7,485,891 B2 | 2/2009 | Hamann et al. | 2006/0157681 A1 | 7/2006 | Chen et al. | |
| 7,488,968 B2 | 2/2009 | Lee | 2006/0163554 A1 | 7/2006 | Lankhorst et al. | |
| 7,502,252 B2 | 3/2009 | Fuji et al. | 2006/0169968 A1 | 8/2006 | Happ | |
| 7,504,653 B2 | 3/2009 | Lung | 2006/0172067 A1 | 8/2006 | Ovshinsky et al. | |
| 7,507,986 B2 | 3/2009 | Lung | 2006/0192193 A1 | 8/2006 | Lee et al. | |
| 7,514,334 B2 | 4/2009 | Chen et al. | 2006/0198183 A1 | 9/2006 | Kawahara et al. | |
| 7,514,705 B2 | 4/2009 | Breitwisch et al. | 2006/0202245 A1 | 9/2006 | Zuliani et al. | |
| 7,515,461 B2 | 4/2009 | Happ et al. | 2006/0205108 A1 | 9/2006 | Maimon et al. | |
| 7,560,337 B2 | 7/2009 | Ho et al. | 2006/0211165 A1 | 9/2006 | Hwang et al. | |
| 7,569,844 B2 | 8/2009 | Lung | 2006/0226409 A1 | 10/2006 | Burr et al. | |
| 7,579,613 B2 | 8/2009 | Lung et al. | 2006/0234138 A1 | 10/2006 | Fehlhaber et al. | |
| 7,606,059 B2 | 10/2009 | Toda | 2006/0237756 A1 | 10/2006 | Park et al. | |
| 7,623,370 B2 | 11/2009 | Toda et al. | 2006/0245236 A1 | 11/2006 | Zaidi | |
| 7,683,360 B2 | 3/2010 | Chen et al. | 2006/0250885 A1 | 11/2006 | Cho et al. | |
| 7,688,619 B2 | 3/2010 | Lung et al. | 2006/0261392 A1 | 11/2006 | Lee et al. | |
| 7,696,503 B2 | 4/2010 | Lung et al. | 2006/0266993 A1 | 11/2006 | Suh et al. | |
| 7,701,759 B2 | 4/2010 | Lung et al. | 2006/0273298 A1 * | 12/2006 | Petti ............ 257/5 | |
| 7,778,063 B2 | 8/2010 | Brubaker et al. | 2006/0284157 A1 | 12/2006 | Chen et al. | |
| 7,868,313 B2 | 1/2011 | Breitwisch et al. | 2006/0284158 A1 | 12/2006 | Lung et al. | |
| 8,030,634 B2 | 10/2011 | Lung et al. | 2006/0284214 A1 | 12/2006 | Chen | |
| 2002/0017701 A1 | 2/2002 | Klersy et al. | 2006/0284279 A1 | 12/2006 | Lung et al. | |
| 2002/0042158 A1 | 4/2002 | Kersch et al. | 2006/0286709 A1 | 12/2006 | Lung et al. | |
| 2002/0070457 A1 | 6/2002 | Sun et al. | 2006/0286743 A1 | 12/2006 | Lung et al. | |
| 2002/0113273 A1 | 8/2002 | Hwang et al. | 2006/0289847 A1 | 12/2006 | Dodge | |
| 2002/0168852 A1 | 11/2002 | Harshfield et al. | 2006/0289848 A1 | 12/2006 | Dennison | |

| | | | | | |
|---|---|---|---|---|---|
| 2007/0007613 A1 | 1/2007 | Wang et al. | 2008/0197334 A1 | 8/2008 | Lung |
| 2007/0008786 A1 | 1/2007 | Scheuerlein | 2008/0224119 A1 | 9/2008 | Burr et al. |
| 2007/0030721 A1 | 2/2007 | Segal et al. | 2008/0225489 A1 | 9/2008 | Cai et al. |
| 2007/0037101 A1 | 2/2007 | Morioka | 2008/0265234 A1 | 10/2008 | Breitwisch et al. |
| 2007/0040159 A1 | 2/2007 | Wang | 2008/0303014 A1 | 12/2008 | Goux et al. |
| 2007/0045605 A1 | 3/2007 | Hsueh | 2008/0310208 A1 | 12/2008 | Daley |
| 2007/0045606 A1 | 3/2007 | Magistretti et al. | 2009/0001341 A1 | 1/2009 | Breitwisch et al. |
| 2007/0051936 A1 | 3/2007 | Pellizzer et al. | 2009/0014704 A1 | 1/2009 | Chen et al. |
| 2007/0096162 A1 | 5/2007 | Happ et al. | 2009/0023242 A1 | 1/2009 | Lung |
| 2007/0096248 A1 | 5/2007 | Philipp et al. | 2009/0027950 A1 | 1/2009 | Lam et al. |
| 2007/0108077 A1 | 5/2007 | Lung et al. | 2009/0042335 A1 | 2/2009 | Lung |
| 2007/0108429 A1 | 5/2007 | Lung | 2009/0047762 A1 * | 2/2009 | Torii ............................. 438/257 |
| 2007/0108430 A1 | 5/2007 | Lung | 2009/0057641 A1 | 3/2009 | Lung |
| 2007/0108431 A1 | 5/2007 | Chen et al. | 2009/0072215 A1 | 3/2009 | Lung et al. |
| 2007/0109836 A1 | 5/2007 | Lung | 2009/0098678 A1 | 4/2009 | Lung |
| 2007/0109843 A1 | 5/2007 | Lung et al. | 2009/0148980 A1 | 6/2009 | Yu |
| 2007/0111429 A1 | 5/2007 | Lung | 2009/0166603 A1 | 7/2009 | Lung |
| 2007/0115794 A1 | 5/2007 | Lung | 2009/0219740 A1 * | 9/2009 | Nagashima et al. ............ 365/51 |
| 2007/0117315 A1 | 5/2007 | Lai et al. | 2009/0242865 A1 | 10/2009 | Lung et al. |
| 2007/0120104 A1 | 5/2007 | Ahn et al. | 2009/0268507 A1 | 10/2009 | Breitwisch et al. |
| 2007/0121363 A1 | 5/2007 | Lung | 2009/0289242 A1 | 11/2009 | Breitwisch et al. |
| 2007/0121374 A1 | 5/2007 | Lung et al. | 2009/0294748 A1 | 12/2009 | Breitwisch et al. |
| 2007/0126040 A1 | 6/2007 | Lung | 2009/0298223 A1 | 12/2009 | Cheek et al. |
| 2007/0131922 A1 | 6/2007 | Lung | 2009/0298276 A1 * | 12/2009 | Lee et al. ...................... 438/597 |
| 2007/0138458 A1 | 6/2007 | Lung | 2010/0019215 A1 | 1/2010 | Lung et al. |
| 2007/0147105 A1 | 6/2007 | Lung et al. | 2010/0019221 A1 | 1/2010 | Lung et al. |
| 2007/0153563 A1 | 7/2007 | Nirschl | 2010/0055830 A1 | 3/2010 | Chen et al. |
| 2007/0154847 A1 | 7/2007 | Chen et al. | 2010/0084624 A1 | 4/2010 | Lung et al. |
| 2007/0155172 A1 | 7/2007 | Lai et al. | 2010/0144128 A1 | 6/2010 | Lung et al. |
| 2007/0156949 A1 | 7/2007 | Rudelic et al. | 2010/0151652 A1 | 6/2010 | Lung et al. |
| 2007/0158632 A1 | 7/2007 | Ho | 2010/0157665 A1 | 6/2010 | Lung et al. |
| 2007/0158633 A1 | 7/2007 | Lai et al. | 2010/0193763 A1 | 8/2010 | Chen et al. |
| 2007/0158645 A1 | 7/2007 | Lung | 2010/0270529 A1 | 10/2010 | Lung |
| 2007/0158690 A1 | 7/2007 | Ho et al. | 2010/0270593 A1 * | 10/2010 | Lung et al. .................... 257/208 |
| 2007/0158862 A1 | 7/2007 | Lung | 2010/0291747 A1 | 11/2010 | Lung et al. |
| 2007/0161186 A1 | 7/2007 | Ho | 2010/0295009 A1 | 11/2010 | Lung et al. |
| 2007/0170881 A1 | 7/2007 | Noh et al. | 2010/0295123 A1 | 11/2010 | Lung et al. |
| 2007/0173019 A1 | 7/2007 | Ho et al. | 2010/0328995 A1 | 12/2010 | Shih et al. |
| 2007/0173063 A1 | 7/2007 | Lung | 2010/0328996 A1 | 12/2010 | Shih et al. |
| 2007/0176251 A1 | 8/2007 | Oh et al. | 2011/0013446 A1 | 1/2011 | Lung |
| 2007/0176261 A1 | 8/2007 | Lung | 2011/0034003 A1 | 2/2011 | Lung |
| 2007/0187664 A1 | 8/2007 | Happ | 2011/0049456 A1 | 3/2011 | Lung et al. |
| 2007/0201267 A1 | 8/2007 | Happ et al. | | | |
| 2007/0215852 A1 | 9/2007 | Lung | | | |
| 2007/0224726 A1 | 9/2007 | Chen et al. | | | |
| 2007/0235811 A1 | 10/2007 | Furukawa et al. | | | |
| 2007/0236989 A1 | 10/2007 | Lung | | | |
| 2007/0246699 A1 | 10/2007 | Lung | | | |
| 2007/0249090 A1 | 10/2007 | Philipp et al. | | | |
| 2007/0252127 A1 | 11/2007 | Arnold et al. | | | |
| 2007/0257300 A1 | 11/2007 | Ho et al. | | | |
| 2007/0262388 A1 | 11/2007 | Ho et al. | | | |
| 2007/0267618 A1 | 11/2007 | Zaidi et al. | | | |
| 2007/0274121 A1 | 11/2007 | Lung et al. | | | |
| 2007/0285960 A1 | 12/2007 | Lung et al. | | | |
| 2007/0298535 A1 | 12/2007 | Lung | | | |
| 2008/0006811 A1 | 1/2008 | Philipp et al. | | | |
| 2008/0012000 A1 | 1/2008 | Harshfield | | | |
| 2008/0014676 A1 | 1/2008 | Lung et al. | | | |
| 2008/0025089 A1 | 1/2008 | Scheuerlein et al. | | | |
| 2008/0043520 A1 | 2/2008 | Chen | | | |
| 2008/0094871 A1 | 4/2008 | Parkinson | | | |
| 2008/0101110 A1 | 5/2008 | Happ et al. | | | |
| 2008/0106923 A1 | 5/2008 | Lung | | | |
| 2008/0116441 A1 | 5/2008 | Raghuram et al. | | | |
| 2008/0137400 A1 | 6/2008 | Chen et al. | | | |
| 2008/0138929 A1 | 6/2008 | Lung | | | |
| 2008/0138930 A1 | 6/2008 | Lung | | | |
| 2008/0138931 A1 | 6/2008 | Lung | | | |
| 2008/0164453 A1 | 7/2008 | Breitwisch et al. | | | |
| 2008/0165569 A1 | 7/2008 | Chen et al. | | | |
| 2008/0165570 A1 | 7/2008 | Happ et al. | | | |
| 2008/0165572 A1 | 7/2008 | Lung | | | |
| 2008/0166875 A1 | 7/2008 | Lung | | | |
| 2008/0179582 A1 | 7/2008 | Burr et al. | | | |
| 2008/0180990 A1 | 7/2008 | Lung | | | |
| 2008/0186755 A1 | 8/2008 | Lung et al. | | | |
| 2008/0191187 A1 | 8/2008 | Lung et al. | | | |
| 2008/0192534 A1 | 8/2008 | Lung | | | |

OTHER PUBLICATIONS

"New Memories Tap Spin, Gird for Battle," Science News, Apr. 3, 1999, p. 223, vol. 155.
"Optimized Thermal Capacitance in a Phase Change Memory Cell Design," IPCOM000141986D, IP.com Prior Art Database, Oct. 18, 2006, 4pp.
"Remembering on the Cheap," www.sciencenews.org, Mar. 19, 2005, p. 189, vol. 167.
"Thermal Conductivity of Crystalline Dielectrics" in CRC Handbook of Chemistry and Physics, Internet Version 2007, (87th edition), David R. Lide, ed. Taylor and Francis, Boca Raton, Fl, 2pp.
Adler, D. et al., "Threshold Switching in Chalcogenide-Glass Thin Films," J. Appl/Phys 51(6), Jun. 1980, pp. 3289-3309.
Adler, David, "Amorphous-Semiconductor Devices," Sci. Amer., vol. 236, pp. 36-48, May 1977.
Ahn, S. J. et al., "A Highly Manufacturable High Density Phase Change Memory of 64 Mb and Beyond," IEEE IEDM Dec. 13-15, 2004, pp. 907-910.
Ahn, S. J. et al., "Highly Reliable 5nm Contact Cell Technology for 256Mb PRAM," VLSI Technology, Digest of Technical Papers, Jun. 14-16, 2005, pp. 98-99.
Atwood, G, et al., "90 nm Phase Change Technology with u Trench and Lance Cell Elements," VLSI Technology, Systems and Applications, Apr. 23-25, 2007, pp. 1-2.
Axon Technologies Corporation paper: Technology Description, published at least as early as Dec. 1997, pp. 1-6.
Bedeschi, F. et al., "4-MB MOSFET-Selected Phase-Change Memory Experimental Chip," IEEE, Sep. 21 to 23, 2004, 4 PP.
Blake thesis, "Investigation of GeTeSb5 Chalcogenide Films for Use as an Analog Memory," AFIT/GE/ENG/00M-04, Mar. 2000, 121 pages.
Chao, Der-Sheng, et al., "Low Programming Current Phase Change Memory Cell with Double GST Thermally Confined Structure," Int'l Symp on VLSI Technology, Systems and Applications, Apr. 23-25, 2007, pp. 1-2.

Chen, AN et al., "Non-Volatile Resistive Switching for Advanced Memory Applications," IEEE IEDM, Dec. 5-7, 2005, 4 pp.

Cho, S. L. et al., "Highly Scalable On-axis Confined Cell Structure for High Density PRAM beyond 256Mb," Jun. 14-16, 2005 Symposium on VLSI Technology Digest of Technical Papers, pp. 96-97.

Gibson, G. A. et al., "Phase-change Recording Medium that Enables Ultrahigh-density Electron-beam Data Storage," Applied Physics Letter, 2005, 3 pp., vol. 86.

Gill, Manzur et al., "A High-Performance Nonvolatile Memory Technology for Stand-Alone Memory and Embedded Applications," Feb. 3-7, 2002 IEEE-ISSCC Technical Digest (TD 12.4), 7 pp.

Gleixner, "Phase Change Memory Reliability", 22nd NVSMW, Aug. 26, 2007, 46 pages.

Ha, Y. H. et al., "An Edge Contact Type Cell for Phase Change RAM Featuring Very Low Power Consumption," Jun. 10-12, 2003 Symposium on VLSI Technology Digest of Technical Papers, pp. 175-176.

Hanzawa, Satoru, et al., "A 512kB Embedded Phase Change Memory with 416kB/s Write Throughput at 100mA Cell Write Current," ISSCC 2007, Session 26, Non-Volatile Memories/26.2, 3 pages.

Happ, T. D. et al., "Novel None-Mask Self-Heating Pillar Phase Change Memory," 2006 Symposium on VLSI Technology, 2 pp.

Haring Bolivar, P. et al., "Lateral Design for Phase Change Random Access Memory Cells with Low-Current Consumption," presented at 3rd E*PCOS 04 Symposium in Balzers, Principality of Liechtenstein, Sep. 4-7, 2004, 4pp.

Horii, H. et al., "A Novel Cell Technology Using N-doped GeSbTe Films for Phase Change RAM," Jun. 10-12, 2003 Symposium on VLSI Technology Digest of Technical Papers, pp. 177-178.

Hudgens, S. et al., "Overview of Phase-Change Chalcogenide Nonvolatile Memory Technology," MRS Bulletin, Nov. 2004, pp. 829-832.

Hwang, Y. N. et al., "Full Integration and Reliability Evaluation of Phase-change RAM Based on 0.24um-CMOS Technologies," Jun. 10-12, 2003 Symposium on VLSI Technology Digest of Technical Papers, pp. 173-174.

Iwasaki, Hiroko et al., "Completely Erasable Phase Change Optical Disk," Jpn. J. Appl. Phys., Feb. 1992, pp. 461-465, vol. 31.

Jeong, C. W. et al., "Switching Current Scaling and Reliability Evaluation in PRAM," IEEE Non-Volatile Semiconductor Memory Workshop, Monterey, CA 2004, pp. 28-29 and workshop cover sheet.

Kim, Kinam et al., "Reliability Investigations for Manufacturable High Density PRAM," IEEE 43rd Annual International Reliability Physics Symposium, San Jose, Apr. 17-21, 2005, pp. 157-162.

Kojima, Rie et al., "Ge—Sn—Sb—Te Phase-change Recording Material Having High Crystallization Speed," Proceedings of PCOS 2000, pp. 36-41.

Lacita, A. L., "Electrothermal and Phase-change Dynamics in Chalcogenide-based Memories," IEEE IEDM Dec. 13-15, 2004, 4 pp.

Lai, Stefan, "Current Status of the Phase Change Memory and its Future," IEEE IEDM Dec. 10, 2003, pp. 255-258.

Lai, Stephan et al., "OUM-A 180 nm Nonvolatile Memory Cell Element Technology for Stand Alone and Embedded Applications," IEEE IEDM Dec. 2-5, 2001, pp. 803-806.

Lankhorst, Martijn H.R., et al; Low-Cost and Nanoscale Non-Volatile Memory Concept for Future Silicon Chips, Mar. 13, 2005, 6 pp., Nature Materials Advance Online Publication, www.nature.com/naturematerials.

Li, Yiming, "Temperature dependence on the contact size of GeSbTe films for phase change memories," J. Comput Electron (2008) 7:138-141.

Mott, Nevill, "Electrons in Glass," Nobel Lecture, Dec. 8, 1977, Physics, 1977, pp. 403-413.

Oh, Hyung-Rok, et al., "Enhanced Write Performance of a 64Mb Phase-Change Random Access Memory," ISSCC 2005, Session 2, Non-Volatile Memory, 2.3, 3 pages.

Ovonyx Non-Confidential paper entitled "Ovonic Unified Memory," Dec. 1999, pp. 1-80.

Ovshinsky, Sandford R., "Reversible Electrical Switching Phenomena in Disordered Structures," Physical Review Letters, vol. 21, No. 20, Nov. 11, 1968, pp. 1450-1453.

Owen, Alan E. et al., "Electronic Conduction and Switching in Chalcogenide Glasses," IEEE Transactions on Electron Devices, vol. Ed. 20, No. 2, Feb. 1973, pp. 105-122.

Pellizer, F. et al.,"Novel u Trench Phase-Change Memory Cell for Embedded and Stand-Alone Non-Volatile Memory Applications," Jun. 15-17, 2004 Symposium on VLSI Technology Digest of Technical Papers, pp. 18-19.

Pirovano, Agostino et al.,"Reliability Study of Phase-Change Nonvolatile Memories," IEEE Transactions on Device and Materials Reliability, Sep. 2004, pp. 422-427, vol. 4, No. 3.

Prakash, S. et al., "A guideline for Designing Chalcogenide-Based Glasses for Threshold Switching Characteristics," IEEE Electron Device Letters, vol. 18, No. 2, Feb. 1997, pp. 45-47.

Radaelli, A. et al., "Electronic Switching Effect and Phase-Change Transition in Chalcogenide Materials," IEEE Electron Device Letters, Oct. 2004, pp. 684-686, vol. 25, No. 10.

Rochefort, C. et al., "Manufacturing of High Aspect-Ration p-n Junctions Using Vapor Phase Doping for Application in Multi-Resurf Devices," IEEE Jun. 4-7, 2002, pp. 237-240.

Schafft, Harry A. et al., "Thermal Conductivity Measurements of Thin Films Silicon Dioxide," Proceedings of the IEEE 1989 International Conference on Microelectronic Test Structures vol. 2, No. 1, Mar. 1989, pp. 121-124.

Strauss, Karl F. et al., "Overview of Radiation Tolerant Unlimited Write Cycle Non-Volatile Memory," IEEE Mar. 18-25, 2000, pp. 399-408.

Subramanian, Vivek et al., "Low Leakage Germanium-Seeded Laterally-Crystallized Single-Grain 100-nm TFT's for Vertical Integration Applications," IEEE Electron Device Letters, vol. 20, No. 7, Jul. 1999, pp. 341-343.

Wicker, Guy et al., Nonvolatile, High Density, High Performance Phase Change Memory, 1999, http://klabs.org/richcontent/MAPLDCon99/Papers/P21_Tyson_P.PDF#search='nonvolatile%20high%20density%20high%20performance%20phase%20change%20memory', 8pages.

Wicker, Guy, "A Comprehensive Model of Submicron Chalcogenide Switching Devices," Doctoral Dissertation, Wayne State University, Detroit, MI 1996, 137 pp.

Gilbert, Nad E., "A macro model of programmable metallization cell devices," Solid-State Electronics 49 (2005) 1813-1819.

Xie et al., "Analysis of higher order pitch division for sub-32nm lithography," Optical Microlithography XXII, Proc. of SPIE vol. 7274, 2009, pp. 1-8.

Yamada, Noboru, "Potential of Ge—Sb—Te phase-change optical disks for high-data-rate recording in the near future," (Conference Proceedings Paper), Jul. 30, 1997, vol. 3109, 10 pages.

Wolf, Stanley, Excerpt from: Silicon Processing for the VLSI Era— vol. 4, pp. 674-679, 2004.

Wuttig, Matthias, "Towards a Universal Memory?" Nature Materials, Apr. 2005, pp. 265-266, vol. 4.

Yi, J. H. et al., "Novel Cell Structure of PRAM with Thin Metal Layer Inserted GeSbTe," IEEE IEDM Dec. 10, 2003, 4 pages.

Yonehara, T. et al., "Control of Grain Boundary Location by Selective Nucleation Over Amorphous Substrates," Mat. Res. Soc. Symp. Proc., vol. 106, 1998, pp. 21-26.

* cited by examiner

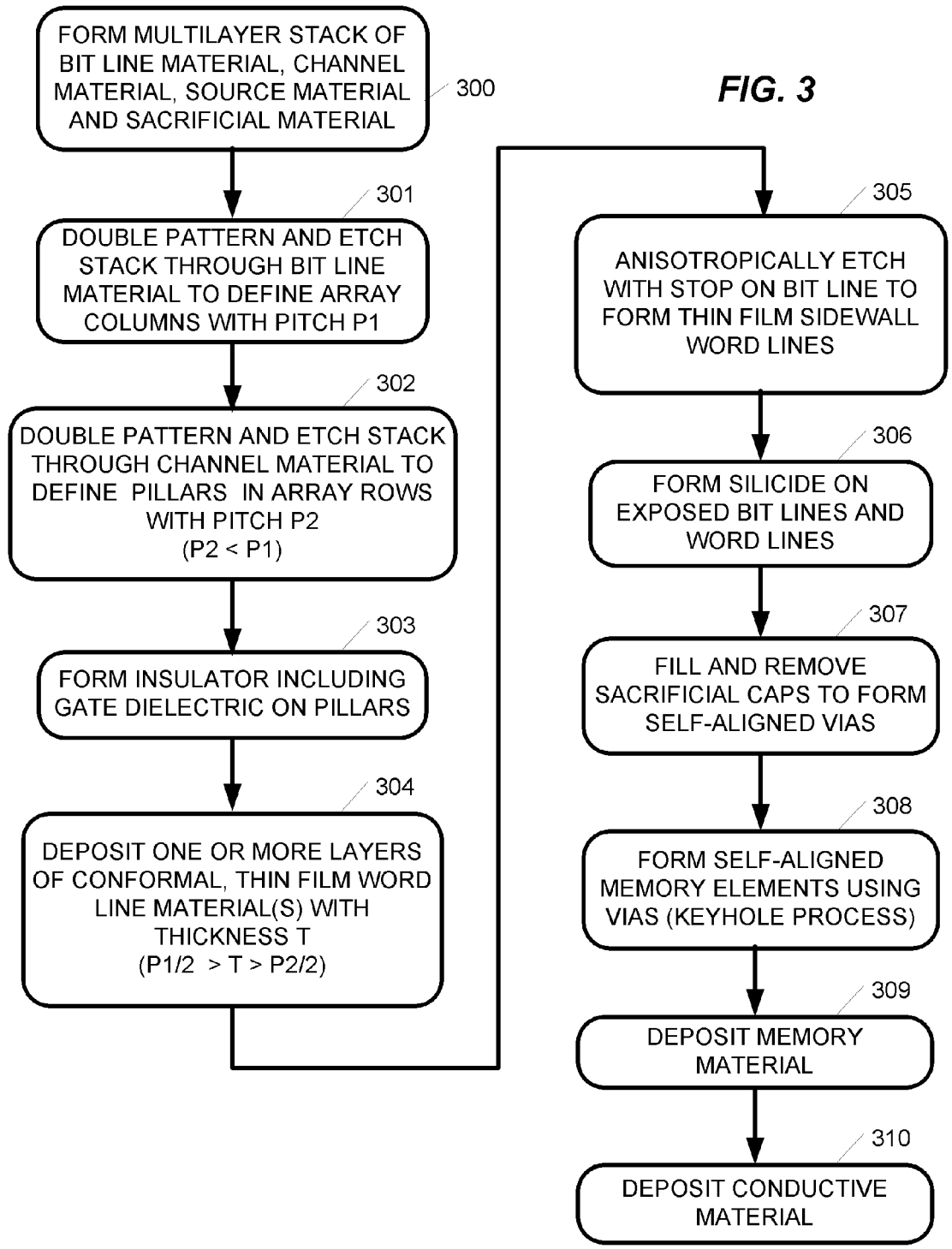

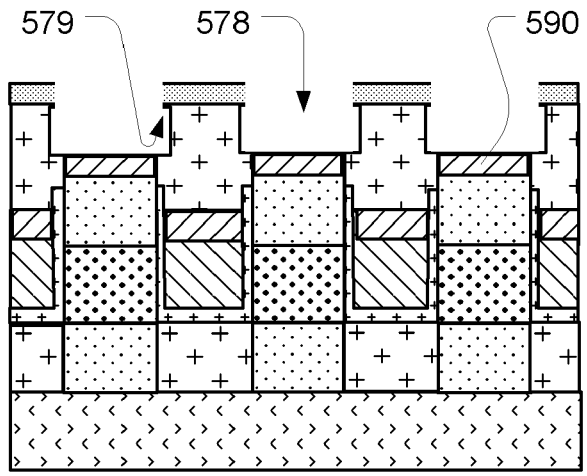
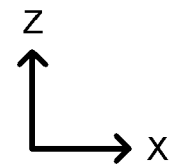
FIG. 15
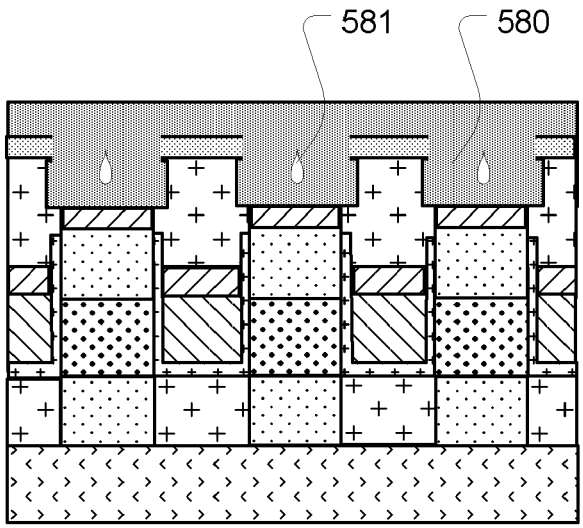
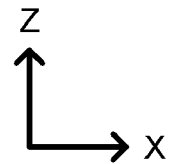
FIG. 16
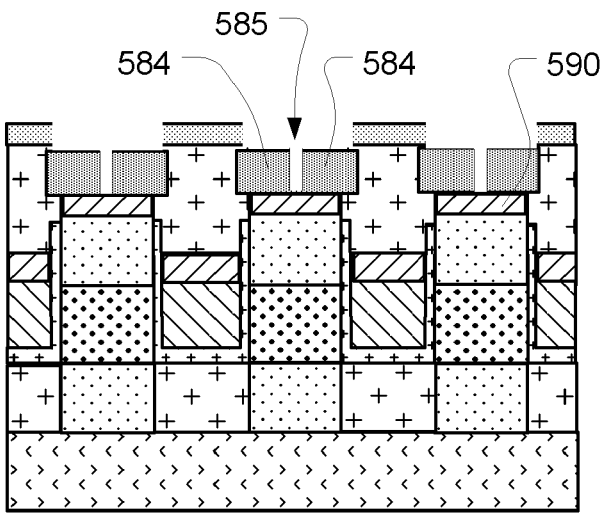
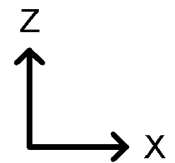
FIG. 17

SELF-ALIGNED BIT LINE UNDER WORD LINE MEMORY ARRAY

PARTIES TO A JOINT RESEARCH AGREEMENT

International Business Machines Corporation, a New York Corporation, and Macronix International Corporation, Ltd., a Taiwan corporation, are parties to a Joint Research Agreement.

BACKGROUND OF THE INVENTION

1. Field of the Invention

The present invention relates to high density memory devices based on phase change memory materials, like chalcogenides, and on other programmable resistance materials, and methods for manufacturing such devices.

2. Description of Related Art

Phase-change-based memory materials, like chalcogenides and similar materials, can be caused to change between an amorphous phase and a crystalline phase by application of electrical current at levels suitable for implementation in integrated circuits. The generally amorphous phase is characterized by higher electrical resistivity than the generally crystalline phase, which can be readily sensed to indicate data. These properties have generated interest in using programmable resistance material to form nonvolatile memory circuits, which can be read and written with random access.

It is desirable to reduce the cross-sectional area or footprint of individual memory cells in an array in order to achieve higher density memory devices. In programmable resistance devices, a limiting factor in the footprint can be the layout of access devices used in the array to select individual cells. One approach to reducing the footprint of access devices in memory arrays has been based on the development of vertical transistors, where the source, channel and drain (or emitter, base and collector) arranged in a stack and extend through a word line or other gate conductor in a manner that aligns the gate with the middle terminal. See for example, commonly owned, co-pending U.S. patent application Ser. No. 12/471, 287, filed: 22 May 2009 (MXIC 1854-1) which is incorporated by reference as if fully set forth herein. However, limitations on the footprint are imposed by the multiple patterning steps required for manufacturing the vertical transistors and the memory elements in contact with them.

It is therefore desirable to provide memory cells having vertical transistor access devices for use in high-density memory devices suitable for use in programmable resistance devices.

SUMMARY OF THE INVENTION

A memory device is described that comprises a plurality of bit lines and an array of vertical transistors arranged on the plurality of bit lines. A plurality of word lines is formed along rows of vertical transistors in the array which comprise thin film sidewalls of word line material and are arranged so that the thin film sidewalls merge in the row direction, and do not merge in the column direction, to form word lines. The word lines provide "surrounding gate" structures for embodiments in which the vertical transistors are field effect transistors. Memory elements are formed in electrical communication with the vertical transistors. The structure can be formed using a fully self-aligned process in which the word lines and memory elements are aligned with the vertical transistors without additional patterning steps. Also, the structure can be formed using a blanket deposition of memory material that is not exposed to etching chemistry near the active region, leaving the memory elements damage free.

In embodiments described herein, the vertical transistors are arranged in columns along the bit lines with a first pitch P1 between the bit lines, and arranged in rows orthogonal to the bit lines with a second pitch P2 between the rows. The sidewalls used to form the word line structures have a thickness which is greater than one half the second pitch P2, and less than one half the first pitch P1, so that the sidewalls can be formed using a typical sidewall spacer process involving a conformal deposition of the word line material followed by an anisotropic etch leaving the sidewalls.

Also embodiments are described in which a bottom electrode structure is self-aligned and self-centered on the top of the vertical transistor. Thus, bottom electrode structures are formed that are centered within perimeters of the contact surfaces formed on top of the vertical transistors. Over the bottom electrode structure, a blanket layer of memory material, such as a phase change material, is formed. A blanket layer of conductive material is then formed over the layer of memory material and coupled to a reference potential. Memory elements at the contact surfaces with the bottom electrode can be individually accessed using the vertical transistor. Alternatively, pore-type memory cells can be formed in a self-centered structure over the tops of vertical transistors.

A method for manufacturing a memory array is described which includes forming a plurality of bit lines, and forming an array of vertical transistors arranged on the plurality of bit lines as described above. According to the process, thin film sidewalls of word line material are formed over the base or channel regions of the vertical transistors to form word lines.

One process includes providing a substrate including a first layer adapted to act as a bit line and drain or collector material, a second layer adapted to act as a base or channel material, and a third layer adapted to act as a source or emitter material. A first patterning process is used to etch trenches through the first, second and third layers to define bit lines in the first layer. A second etch process is used in defined trenches in an orthogonal direction through the second and third layers whereby pillars remain on the bit lines that include channels or bases and second terminals of corresponding vertical transistors. A double or manifold patterning process can be used for one or both of the first and second patterning processes.

Embodiments are described in which a sacrificial layer is also provided on the multilayer stack to the first and second patterning processes. Upon completion of the patterning, the sacrificial layer remains as a cap on the top of the vertical transistor. Removal of the cap results in formation of a self-aligned via over the vertical transistors, which can be used to form a self-aligned and self-centered memory element as described herein.

The technology described here provides for manufacturing a fully self-aligned, surrounding gate transistor which is suitable for use in phase change memory or other programmable resistance memory applications. A process can involve using a first line pattern to define bit lines based on a stack structure including source, drain and channel materials for a vertical transistor and a dummy layer on top. Then a second line pattern can be used to define the vertical channel of the surrounding gate transistor. The intersection of the first and second line patterns form a self-aligned vertical channel on the corresponding bit line. The spacing in the word line direction is smaller than that in the bit line direction. A semiconductor, like polysilicon, a metal or a combination of semiconductor and metal is used to form a gate material spacer on the sides of the pillars. The gate material shorts together in the word line direction to form self-aligned word lines. The top dummy layer can be used to form a self-aligned via, which in turn is used to form a self-aligned bottom electrode or pore for the memory elements. Finally, phase change material and top electrode material are put on top of the array. The phase change material in this process does not need to be patterned into small pieces to fit within the bit lines.

Other aspects and advantages of the present invention can be seen on review of the drawings, the detailed description, and the claims which follow.

BRIEF DESCRIPTION OF THE DRAWINGS

FIG. 3 is a simplified flowchart for manufacturing process which can be used to make a structure as shown in FIGS. 2A-2C.

FIGS. 12-17 illustrate stages in a keyhole transfer process utilized to form self-aligned contact and self-centered bottom electrode structures over vertical transistors as described herein.

DETAILED DESCRIPTION

A detailed description of embodiments of the technology described herein is provided with reference to FIGS. 1-24.

Figure 1:
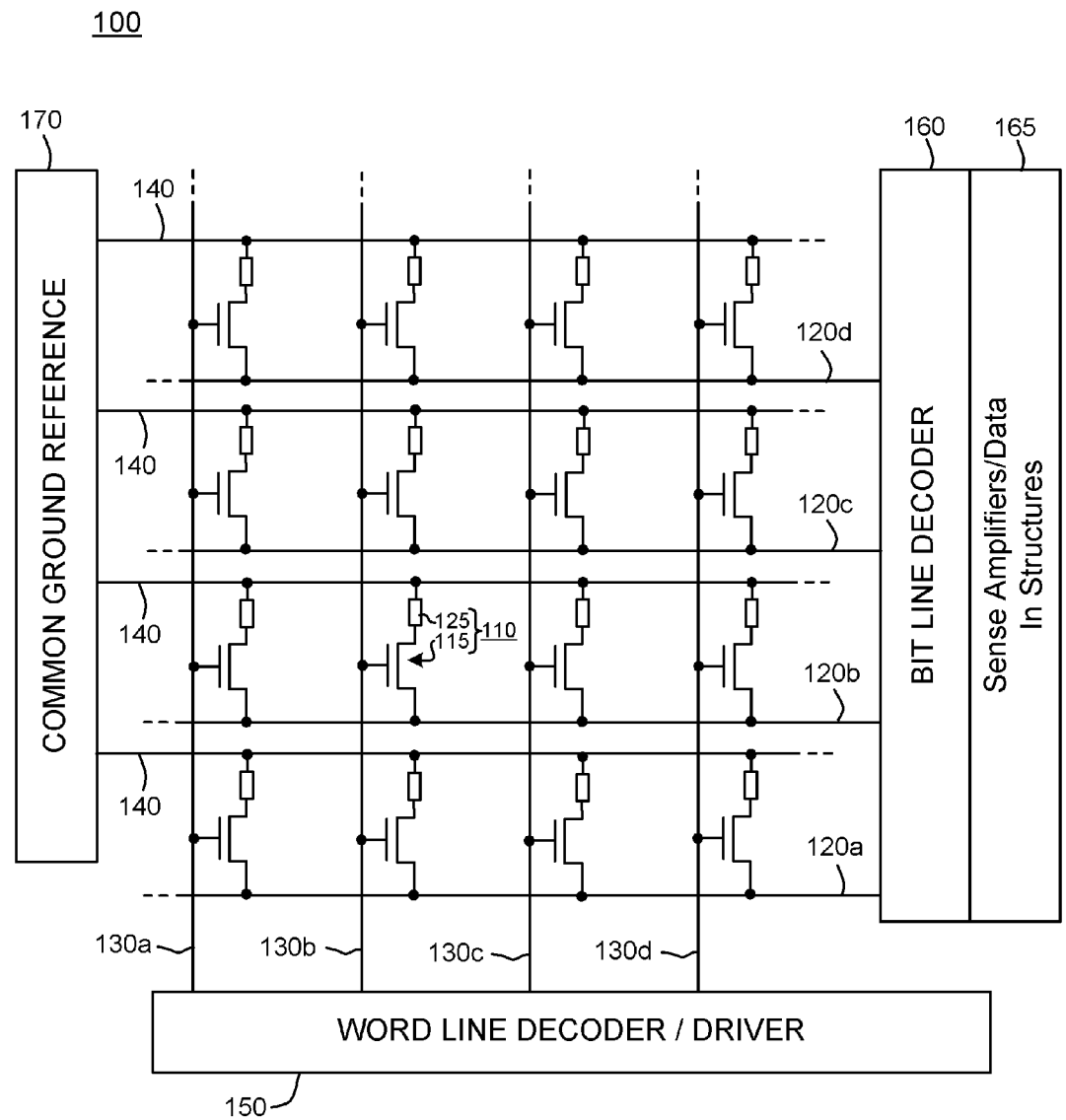
FIG. 1 is a schematic diagram of a portion of a memory cell array implemented using programmable resistance memory cells according to the prior art.

FIG. 1 is a schematic diagram of a portion of a memory cell array 100 implemented using programmable resistance memory cells, as is typical of prior art integrated circuit memory designs. The array 100 comprises a plurality of bit lines 120a-120d extending in parallel in a first direction and in electrical communication with bit line decoder 160. A plurality of word lines 130a, 130b, 130c, 130d extend in parallel in a second direction and are in electrical communication with word line decoder/driver 150. In the schematic diagram of FIG. 1, each of the memory cells (e.g. memory cell 110) of array 100 includes a field effect transistor access device (e.g. transistor 115) and a memory element (e.g. element 125) arranged in electrical series between a bit line (e.g. 120b) via a memory plane 140 (represented by horizontal lines in this illustration) and a common ground reference 170 via memory plane 140. Bipolar junction transistors and diodes can also be used as access devices in memory arrays of this sort.

The manufacturing steps required for the combination of the access devices and the memory elements, along with the layout of the word lines and bit lines include a number of independent alignment steps in the prior art. Alignment steps typically involve placement of masks or other steps that can be executed only within a predetermined alignment tolerance. So, the layout of the memory array must be expanded to accommodate these alignment tolerances.

Memory cell 110 is representative of memory cells of array 100 and comprises field effect transistor 115 and a programmable resistance memory element 125, comprising a phase change material, for example, arranged electrically in series between the memory plane 140 and the corresponding bit line 120b. The word line 130b acts as the gate terminal of the transistor 115, and the first terminal (acting as the source or drain of the transistor 115) is coupled to bit line 120b.

Reading or writing to a phase change memory cell 110 of array 100 can be achieved by applying an appropriate voltage to the corresponding word line 130b and an appropriate voltage or current to the corresponding bit line 120b to induce a current through the memory element 125. The level and duration of the voltages/currents applied is dependent upon the operation performed, e.g. a reading operation or a writing operation.

In a reset (erase) operation of the phase change memory cell 110, a reset pulse applied to the word line 130b and the bit line 120b induces a current through the memory element 125 to cause a transition of an active region of the memory element 125 into an amorphous phase, thereby setting the phase change material to a resistance within a resistance value range associated with the reset state. The reset pulse is a relatively high energy pulse, sufficient to raise the temperature of at least the active region of the memory element 125 above the transition (crystallization) temperature of the phase change material and also above the melting temperature to place at least the active region in a liquid state. The reset pulse is then quickly terminated, resulting in a relatively quick quenching time as the active region quickly cools to below the transition temperature so that the active region stabilizes to a generally amorphous phase.

In a set (or program) operation of phase change memory cell 110, a program pulse is applied to the word line 130b and the bit line 120b of suitable amplitude and duration to induce a current through the memory element 125 sufficient to raise the temperature of at least a portion of the active region of the memory element 125 above the transition temperature and cause a transition of at least a portion of the active region from the amorphous phase into a crystalline phase, this transition lowering the resistance of the memory element 125 and setting the memory cell 110 to the desired state.

In a read (or sense) operation of the data value stored in the memory cell 110, a read pulse applied to the corresponding word line 130b and the corresponding bit line 120b of suitable amplitude and duration to induce current to flow through the memory element 125 that does not result in the memory element 125 undergoing a change in resistive state. The current through the memory cell 110 is dependent upon the resistance of the memory element 125 and thus the data value stored in the memory cell 110. The data valued stored in the memory cell 110 may be determined, for example, by comparison of the current on bit line 120b with a suitable reference current by sense amplifiers of block 165. Alternatively, the data value stored in the memory cell 110 may be determined, for example, using source side sensing by comparison of the current on the conductive material of the memory plane 140 with a suitable reference current.

Embodiments of the programmable resistance material of the memory elements include phase-change-based memory materials, including chalcogenide based materials and other materials. Chalcogens include any of the four elements oxygen (O), sulfur (S), selenium (Se), and tellurium (Te), forming part of group VIA of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from group IVA of the periodic table of elements, such as germanium (Ge) and tin (Sn). Often, chalcogenide alloys include combinations including one or more of antimony (Sb), gallium (Ga), indium (In), and silver (Ag). Many phase-change-based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_aGe_bSb_{100-(a+b)}$. One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky 5,687,112 patent, cols. 10-11.) Particular alloys evaluated by another researcher include $Ge_2Sb_2Te_5$, $GeSb_2Te_4$ and $GeSb_4Te_7$ (Noboru Yamada, "Potential of Ge—Sb—Te Phase-Change Optical Disks for High-Data-Rate Recording", SPIE v.3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistance properties. Specific examples of memory materials that may be useful are given in Ovshinsky '112 at columns 11-13, which examples are hereby incorporated by reference.

Chalcogenides and other phase change materials are doped with impurities in some embodiments to modify conductivity, transition temperature, melting temperature, and other properties of memory elements using the doped chalcogenides. Representative impurities used for doping chalcogenides include nitrogen, silicon, oxygen, silicon dioxide, silicon nitride, copper, silver, gold, aluminum, aluminum oxide, tantalum, tantalum oxide, tantalum nitride, titanium and titanium oxide. See, e.g., U.S. Pat. No. 6,800,504, and U.S. Patent Application Publication No. U.S. 2005/0029502.

Phase change alloys can be changed from one phase state to another by application of electrical pulses. It has been observed that a shorter, higher amplitude pulse tends to change the phase change material to a generally amorphous state. A longer, lower amplitude pulse tends to change the phase change material to a generally crystalline state. The energy in a shorter, higher amplitude pulse is high enough to allow for bonds of the crystalline structure to be broken and short enough to prevent the atoms from realigning into a crystalline state. Appropriate profiles for pulses can be determined, without undue experimentation, specifically adapted to a particular phase change alloy. In following sections of the disclosure, the phase change material is referred to as GST, and it will be understood that other types of phase change materials can be used. A material useful for implementation of a PCRAM described herein is $Ge_2Sb_2Te_5$.

Other programmable resistance memory materials may be used in other embodiments of the invention, including other materials that use different crystal phase changes to determine resistance, or other memory materials that use an electrical pulse to change the resistance state. Examples include materials for use in resistance random access memory (RRAM) such as metal-oxides including tungsten-oxide ($WO_x$), $NiO$, $Nb_2O_5$, $CuO_2$, $Ta_2O_5$, $Al_2O_3$, $CoO$, $Fe_2O_3$, $HfO_2$, $TiO_2$, $SrTiO_3$, $SrZrO_3$, $(BaSr)TiO_3$. Additional examples include materials for use in magnetoresistance random access memory (MRAM) such as spin-torque-transfer (STT) MRAM, for example at least one of CoFeB, Fe, Co, Ni, Gd, Dy, CoFe, NiFe, MnAs, MnBi, MnSb, $CrO_2$, $MnOFe_2O_3$, $FeOFe_2O_5$, $NiOFe_2O_3$, $MgOFe_2$, EuO, and $Y_3Fe_5O_{12}$. See, for example, US Publication No 2007/0176251 entitled "Magnetic Memory Device and Method of Fabricating the Same," which is incorporated by reference herein. Additional examples include solid electrolyte materials used for programmable-metallization-cell (PMC) memory, or nano-ionic memory, such as silver-doped germanium sulfide electrolytes and copper-doped germanium sulfide electrolytes. See, for example, N. E. Gilbert et al., "A macro model of programmable metallization cell devices," Solid-State Electronics 49 (2005) 1813-1819, which is incorporated by reference herein.

An exemplary method for forming chalcogenide material uses PVD-sputtering or magnetron-sputtering method with source gas(es) of Ar, $N_2$, and/or He, etc. at the pressure of 1 mTorr~100 mTorr. The deposition is usually done at room temperature. A collimator with an aspect ratio of 1~5 can be used to improve the fill-in performance. To improve the fill-in performance, a DC bias of several tens of volts to several hundreds of volts is also used. Also, a combination of DC bias and a collimator can be used.

An exemplary method for forming chalcogenide material uses chemical vapor deposition CVD such as that disclosed in US Publication No 2006/0172067 entitled "Chemical Vapor Deposition of Chalcogenide Materials," which is incorporated by reference herein.

A post-deposition annealing treatment in a vacuum or in an $N_2$ ambient is optionally performed to improve the crystallize state of chalcogenide material. The annealing temperature typically ranges from 100° C. to 400° C. with an anneal time of less than 30 minutes.

A memory cell and array structure can be made as described herein using a fully-self-aligned process, reducing the layout area required for the array, and without exposing active areas of the memory material to etch chemistry which might damage the performance of the device.

Figure 2A:
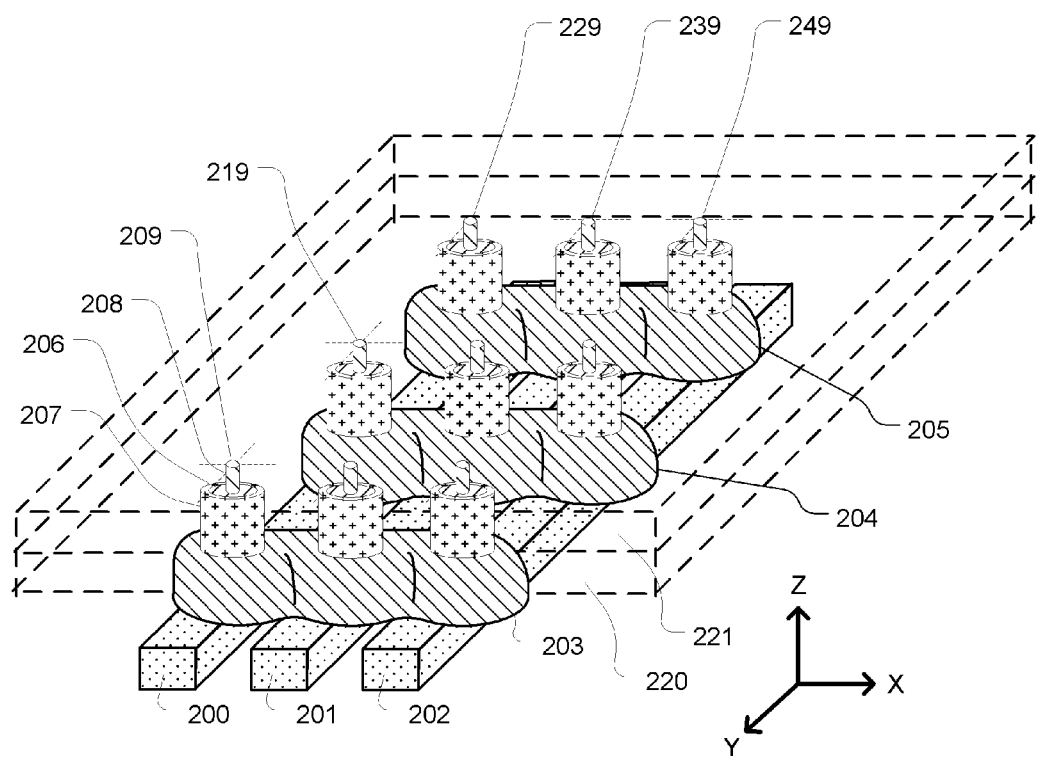
FIGS. 2A-2C are perspective and cross-section views of a memory array structure including vertical transistor access devices with fully self-aligned word lines and memory elements.
Figure 2B:
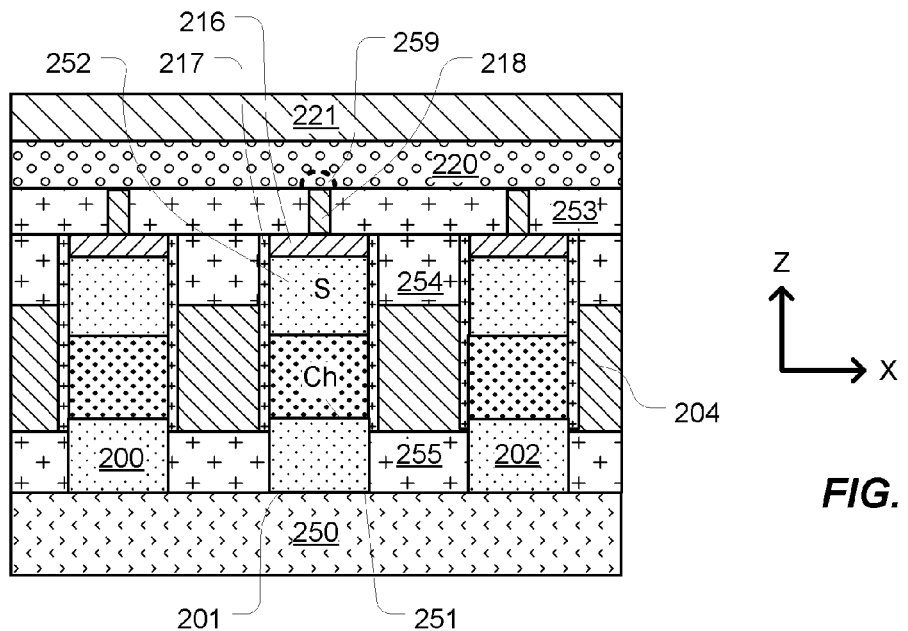
Figure 2C:
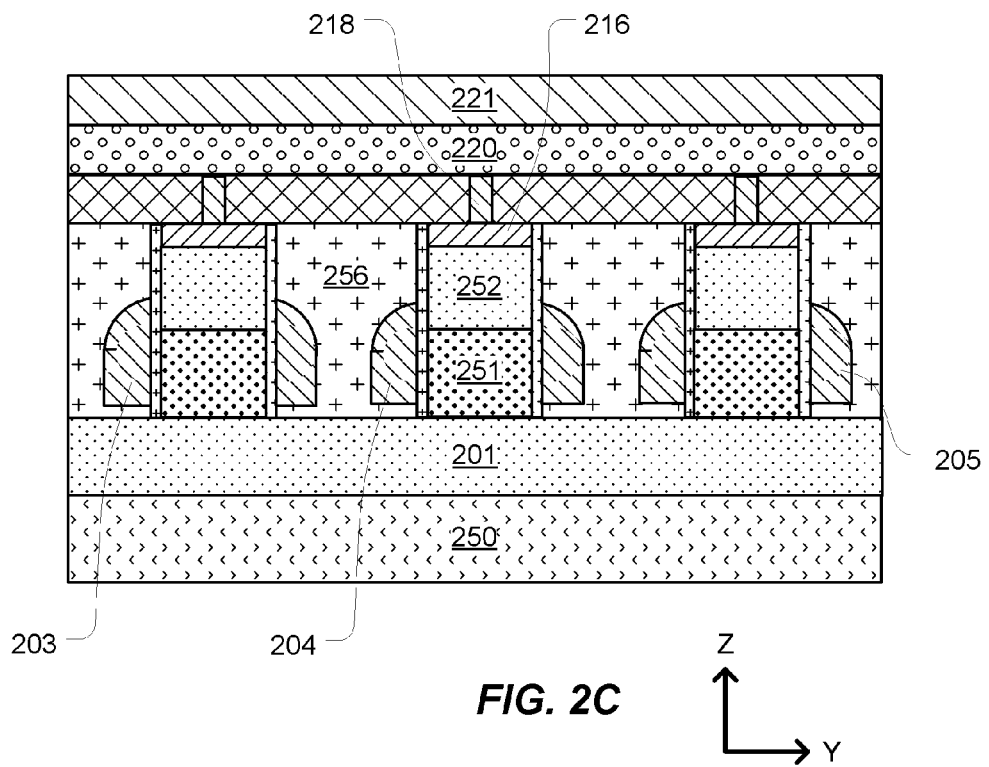

One example structure is shown in perspective view in FIG. 2A and cross-section views in FIGS. 2B and 2C, based on use of phase change materials. In FIG. 2A, a memory plane is illustrated in outline, including a layer 220 of phase change material and a layer 221 of conductive material, where the layer 221 of conductive material is adapted to be coupled to a ground reference or other common reference potential. Access devices and bottom electrodes are coupled to the memory plane. The contact surfaces (e.g. 209) of the bottom electrodes (e.g. 208) which are coupled to respective access devices contact the layer 220 of phase change material. The memory elements comprise an active portion of the layer of phase change material at each of those contact surfaces, including surfaces 219, 229, 239, 249 and so on.

The access array includes a plurality of bit lines 200, 201, 202, which are implemented in this illustration by strips of conductive semiconductor material formed on an integrated circuit substrate (not shown). Vertical transistors are formed in columns along the bit lines having drain terminals on the corresponding bit lines. The pillars include a first layer acting as the channel and a second layer acting as the source, and are surrounded by a gate dielectric. These structures can be seen in more detail with reference to the cross-sections in FIGS. 2B and 2C. It can be seen in FIG. 2A, that a source terminal in a vertical transistor has a contact surface 206, and is surrounded by a layer 207 of gate dielectric in the illustrated embodiment, and acts as an access device for the memory element at contact surface 209 on top of the bottom electrode 208. A bottom electrode 208 is formed on the contact surface 206 of the source terminal.

Gates on the access devices are formed using word lines 203, 204, 205 that comprise thin film sidewalls of word line material. Access devices are arranged in the array so that the spacing in the column direction along the bit lines is more than twice the thickness of the thin film sidewalls used to form the word lines, while the spacing in the row direction along the word lines is less than twice the thickness of the thin film sidewalls, so that the sidewalls merge in the row direction to form word lines, but do not merge in the column direction. In this manner, the word lines can be formed in a self-aligned, sidewall spacer type process without requiring a separate patterning step. In embodiments in which the vertical transistors have a rounded cylindrical shape as shown in FIG. 2A, the sidewall spacer process for formation of word lines results in a "wavy" shape because of the conformal nature of the sidewall formation process.

FIG. 2B is a cross-section in the Z-X plane of the structure of FIG. 2A, taken in the word line direction. Bit lines 200, 201 and 202 are shown in cross-section, formed on a substrate 250. The substrate 250 can be a semiconductor or insulator as suits the particular implementation. A vertical transistor in the array includes a drain in the bit line 201, a channel 251 and a source 252. A gate dielectric 217 separates the channel 251 from the word line 204. The contact surface 216 on the terminal acting as source 252 can comprise layer of silicide, for example. Alternatively other metals or conductive materials can be used. A bottom electrode 218 is formed in contact with the contact surface 216. The memory element 259 includes the active region in the layer 220 of phase change material. The layer 221 of conductive material overlies the layer 220 of phase change material. The sidewall thin film used to form the word line 204 merges along the word line direction to form a conductive line acting as gates for the vertical transistors in a row in the array.

Insulating fill material 255 separates the bit lines, while insulating fill material 253, 254 separates the source terminals (e.g. 252) and the bottom electrodes (e.g. 218) in the structure.

FIG. 2C is a cross section in the Z-Y plane of the structure of FIG. 2A, taken in the bit line direction. Word lines 203, 204, 205 are shown in cross-section, over bit line 201 which lies on substrate 250. The drain of the vertical transistors is formed in the bit line 201, and a channel 251 overlies the bit line 201. A source 252 overlies the channel 251. A contact surface 216 lies on the source 252. A bottom electrode 218 extends between the contact surface 216 on the source, and the layer 220 of phase change material. Layer 221 of conductive material overlies the layer 220 of phase change material.

As illustrated, word line 204 includes thin film sidewalls that are separated by insulating fill 256 from adjacent word lines 203, 205. Also the distance between the vertical transistors is greater in the column direction (Y-axis) than in the row direction (X-axis).

The structures described here result in formation of vertical field effect transistors having drains, channels and sources. In alternatives, bipolar junction transistors can be formed where the terminals comprise collector, base and emitter. Similar manufacturing processes can be used for both alternatives, with the exception, of course, of the use of gate dielectric material in the field effect transistor structure.

FIG. 3 is a flowchart for a manufacturing process which can be used to form the structure of FIGS. 2A-2C. In a first step, a multilayer stack of bit line material, channel material, source material and sacrificial material is formed on a substrate (300). As mentioned above, the bit line material may comprise a portion of a semiconductor substrate, may be a semiconductor deposited on a different substrate material, may be a metal, and may be a combination of materials to accommodate use as a bit line and as a drain terminal. In a next step, a double patterning process or manifold patterning process is used to define lines and etch narrow trenches through the multilayer stack including through the bit line material, to define array columns with a pitch P1 (301). Then, a double patterning or manifold patterning process is used to define lines and etch the stack through the channel material, stopping at or near a surface of the bit line layer, to define pillars along the bit lines in rows with a pitch P2, where the pitch P2 along the rows is less than the pitch P1 along the columns (302). A process can be applied to round or soften edges of the pillars if desired. Next, an insulator suitable for acting as the gate dielectric is deposited over the pillars, including over the channel material in the pillars (303). After forming the gate dielectric layer, one or more layers of conformal, thin film word line material is deposited over the structure having a thickness T, which is less than ½ P1 and greater than ½ P2 (304). In the next step, thin film sidewalls are formed by anisotropic etching of the word line material, stopping at or near a surface of the bit line layer so that the thin film sidewalls of word line material merge in the row direction, and are separated in the column direction (305). In a next step, a silicide or other contact material can be formed on the exposed bit lines and word lines (306). Next, an insulating fill is applied to the structure, and planarized to expose a cap of sacrificial material on the pillars. The sacrificial cap is then removed to form self-aligned vias over the vertical transistors (307). In a next step, self-aligned memory elements are formed using the vias, such as by forming bottom electrode structures within the vias, or forming pores within the vias that can be later filled with memory material (308). In a next step, a layer of memory material, such as a phase change material made of a doped chalcogenide is deposited over the structure, contacting the bottom electrode structures or filling the pores (309). In a next step, a layer of conductive material is deposited over the layer of memory material (310).

Figure 4A:
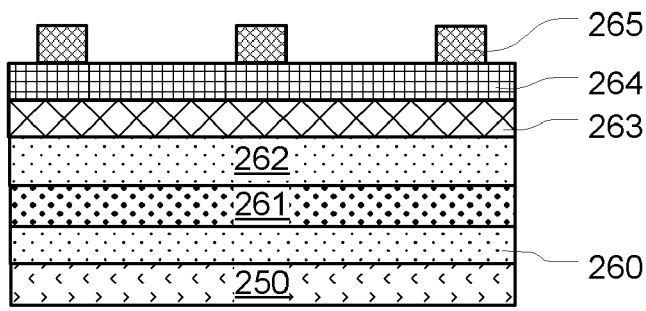
FIGS. 4A-4E show stages of a double patterning process which can be used in a process like that of FIG. 3.
Figure 4B:
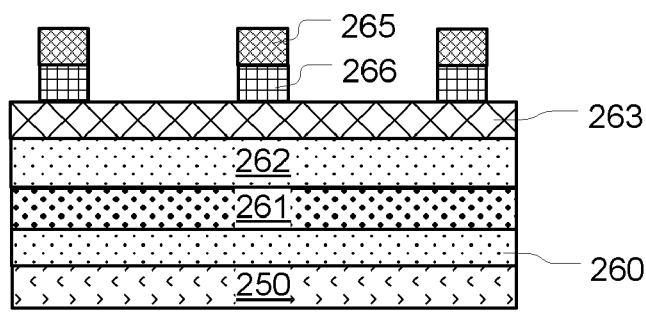
Figure 4C:
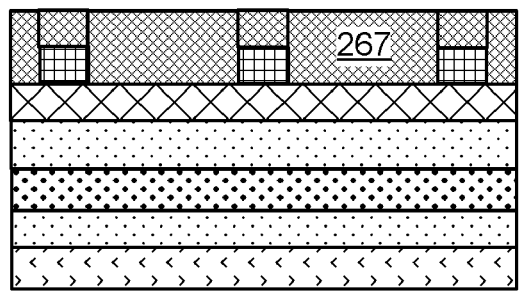
Figure 4D:
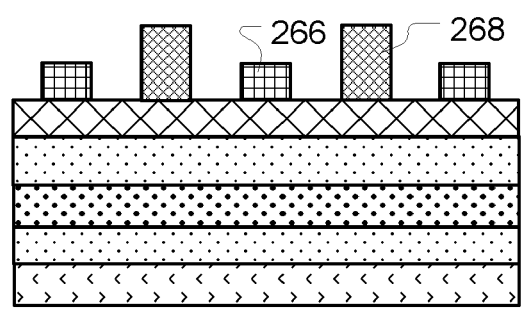
Figure 4E:
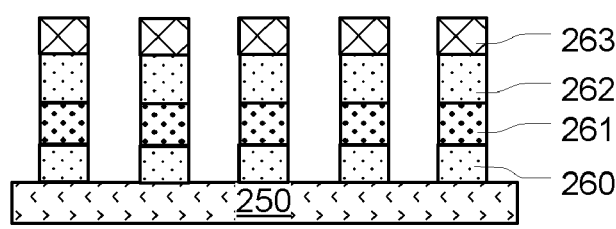

FIGS. 4A-4E illustrate a double patterning process, specifically a double patterning pitch division DPPD technique, which is suitable for use in steps 301 and 302 of the process described above. As shown in FIG. 4A, a multilayer stack on a substrate 250 is formed, including a layer 260 of bit line material (e.g. doped semiconductor), a layer 261 of channel material (e.g. doped semiconductor), layer 262 of source material (e.g. doped semiconductor), and a layer 263 of sacrificial material (e.g. silicon nitride). Over the layer 263 of sacrificial material, a first hard mask material 264 is deposited followed by a second hard mask material 265. At this stage illustrated in FIG. 4A, the second hard mask material 265 has been patterned to define strips extending in the Y-direction perpendicular to the page. In the next stage illustrated in FIG. 4B, the strips of the second hard mask material 265 are used as a mask to etch corresponding strips 266 in the first hard mask material. Next, as shown in FIG. 4C, a third layer 267 of hard mask material, which can be the same material as the second hard mask material 265, is deposited and planarized over the structure. Then, as shown in FIG. 4D, the third layer 267 is patterned and etched to define hard mask strips 268 between the hard mask strips 266 over the multilayer structure. Finally, as shown in FIG. 4E, the hard mask strips 268, 266 define lines used as a mask in an etch process to form trenches extending through the multilayer stack and separating the layer 260 of bit line material into individual bit lines, with ridges of channel material from layer 261, the source material from layer 262, and sacrificial material from layer 263 overlying the bit lines. The pitch P1 of each of the bit lines can be relatively small because of the double patterning process.

Other double patterning or manifold patterning processes, such as spacer-based pitch division SBPD and others, can be used to define narrow bit lines with a small pitch P1. For example, Xie et al., "Analysis of higher-order pitch division for sub-32 nm lithography," Optical Microlithography XXII, edited by Harry J. Levinson, et al., Proc. of SPIE Vol. 7274 (2009), describes several techniques usable for double, triple and quadruple patterning. Also combinations of double and manifold patterning processes can be used to establish smaller and smaller pitches.

Figures 5A, 5B, 6:
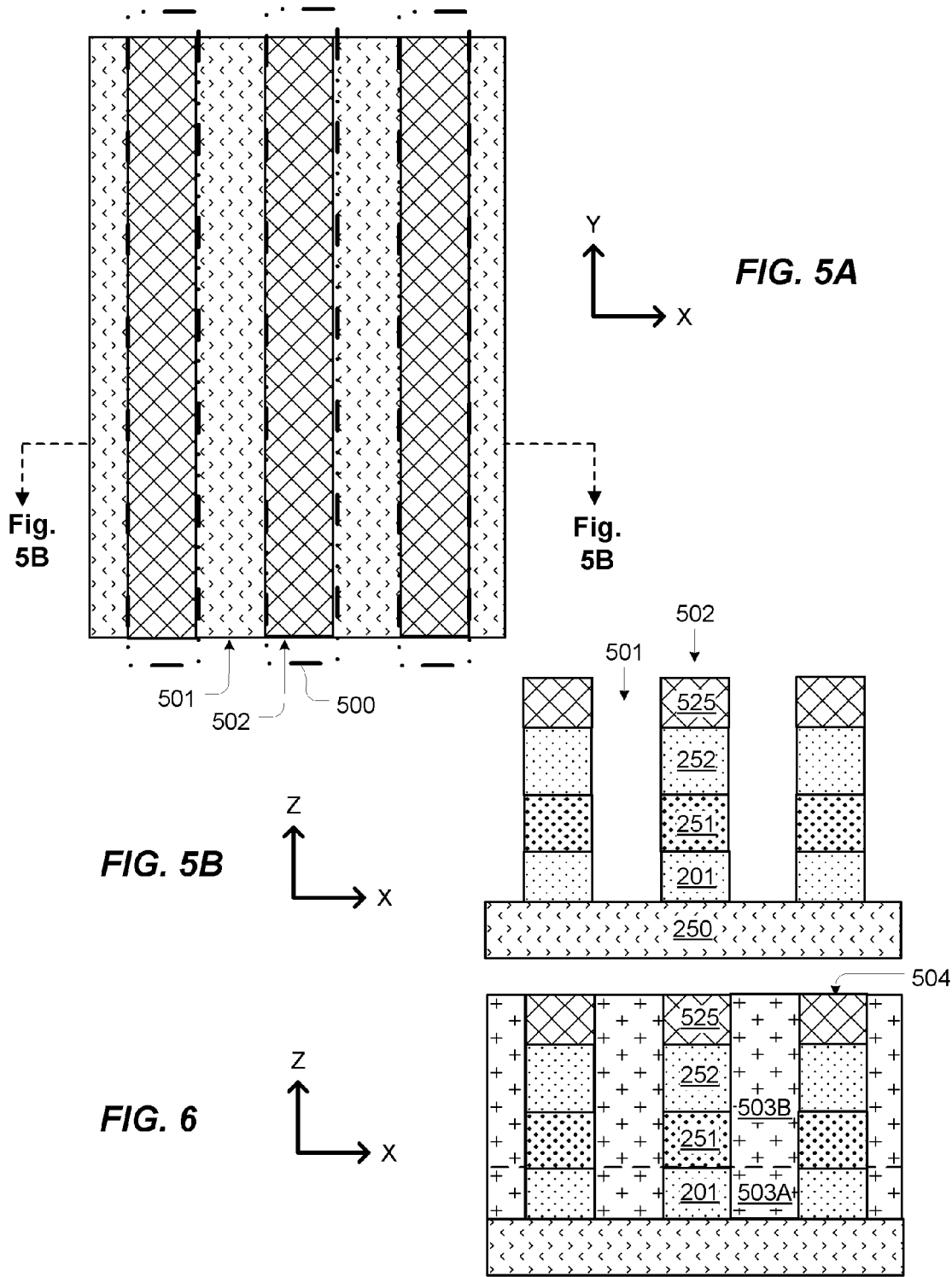
FIGS. 5A-5B show a layout and cross-section view of a first illustrated stage in a manufacturing process for a memory array as described herein with patterned bit line ridges.
FIG. 6 shows a cross-section view of the next stage in the manufacturing process with insulating fill between the bit line ridges.

FIGS. 5A and 5B show a layout view in the X-Y plane and a cross-section view in the X-Z plane of the structure after a first double patterning or other patterning process is applied to define ridges. In layout, the patterning is shown in FIG. 5A. An etch mask 500 is formed, and used to etch trenches 501 in the multilayer stack resulting in ridges 502 underneath an etch mask 500. Of course, many hundreds or thousands of ridges and trenches can be defined for high density memory. As shown in FIG. 5B, the ridges, such as ridge 502, include a bit line 201 from the bit line layer 260, a channel 251 from the channel layer 261, a source 252 from the source layer 262, and a strip of sacrificial material 525 from the sacrificial layer 263.

A next stage is shown in FIG. 6, after an insulating fill material 503A/503B is formed between the ridges and planarized so that the top surface 504 exposes the sacrificial material on the top of the ridges. The insulating fill material can include a first material 503A such as a silicon nitride for example, in the bottom of the trench up to a level near the beginning of the channel 251, and a second material 503B, such as a silicon oxide for example, filling the balance of the trench. Alternatively, the materials 503A and 503B could be the same and formed in a single deposition step.

Figure 7A:
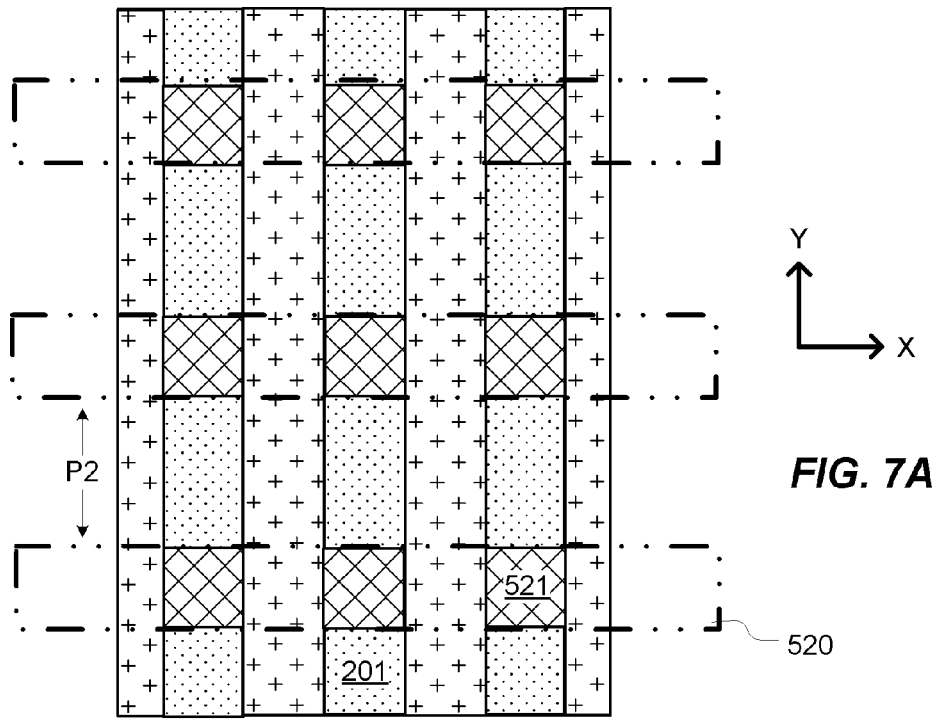
FIGS. 7A-7C show layout and cross-section views of a next stage in the manufacturing process after patterning lines to form pillars in the row dimension.
Figure 7B:
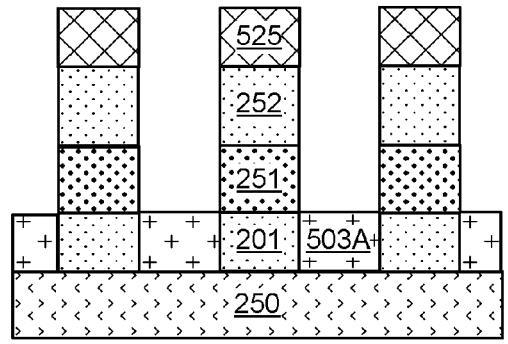
Figure 7C:
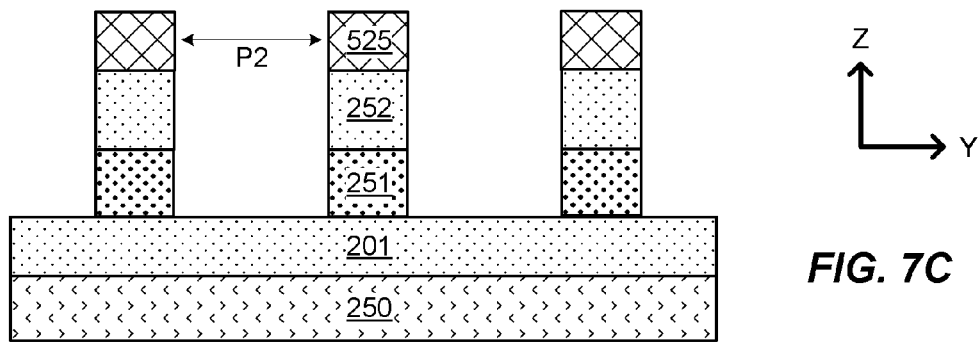

FIGS. 7A, 7B and 7C show a layout view in the X-Y plane, a cross-section view in the X-Z plane and a cross-section view in the Y-Z plane, respectively, of the structure after a second double patterning or other patterning process is applied to define rows of pillars on the bit lines. The second patterning process is used to define a mask 520 which is arranged orthogonal to the bit lines 201. The mask 520 is used to etch trenches (e.g. 521) with a pitch P2 in the bit line dimension which is wider than the pitch P1 between the bit lines 201. The trenches are etched down to the top surface of the bit line material 201, so that the bit line 201 remains continuous while the individual pillars including channels 251, sources 252 and sacrificial material 525 are left separated as illustrated in FIGS. 7B and 7C. As can be seen in FIG. 7B, insulating material 503B can remain between the bit lines 201 after this etching process.

Figure 8:
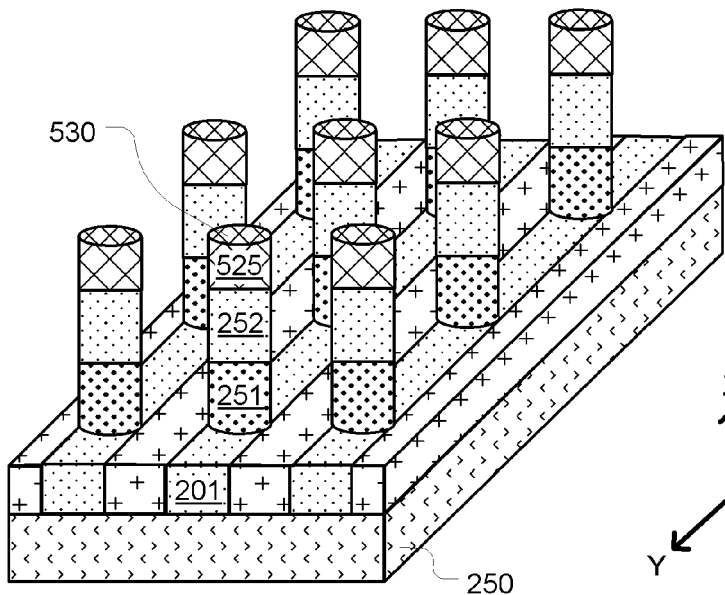
FIG. 8 shows a perspective view of a vertical transistor pillars made according to processes described herein.

FIG. 8 is a perspective view of the resulting structure, after a hydrogen anneal or other process used to round off or soften edges of the pillars. Thus, FIG. 8 illustrates three columns along the bit line direction (Y-axis) and three rows along the word line direction (X-axis) of pillars to be used to form vertical transistors for an access array. Each of the pillars can have a rounded cylindrical shape as indicated on either top surface 530, and include a channel 251 and a source 252 with a cap of sacrificial material 525. The drain on the vertical transistor is part of the bit line 201 in this example. In alternative examples, an additional drain element could be added between the channel 251 and the bit line 201.

Figure 9A:
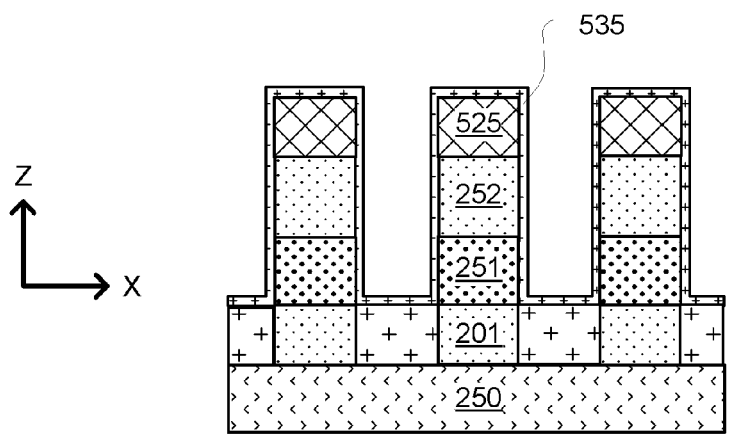
FIGS. 9A-9B illustrate formation of the gate dielectric layer over the pillars of FIG. 8.
Figure 9B:
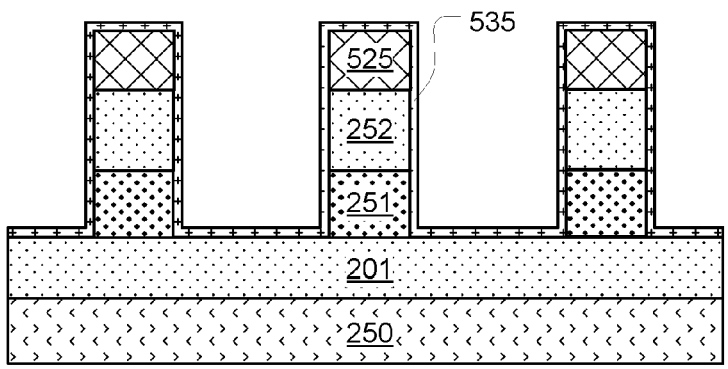

FIGS. 9A and 9B show a cross-section view in the X-Z plane and a cross-section view in the Y-Z plane, respectively, of the structure after forming a layer 535 of gate dielectric material over the pillars including a layer over the channel 251 in each of the pillars. The gate dielectric material could comprise silicon dioxide, silicon nitride, zirconium oxide, hafnium oxide, aluminum oxide or other dielectrics such as high-K dielectrics suitable for use with small dimension, vertical FET transistors.

Figure 10A:
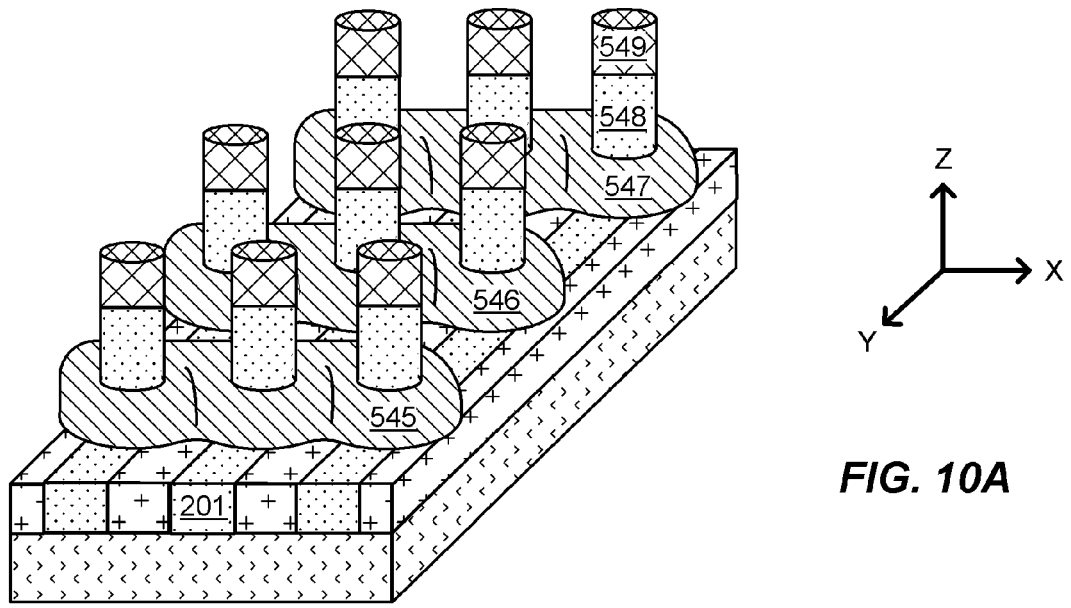
FIGS. 10A-10D show perspective, layout and cross-section views after formation of thin film sidewall word line structures as described herein.
Figure 10B:
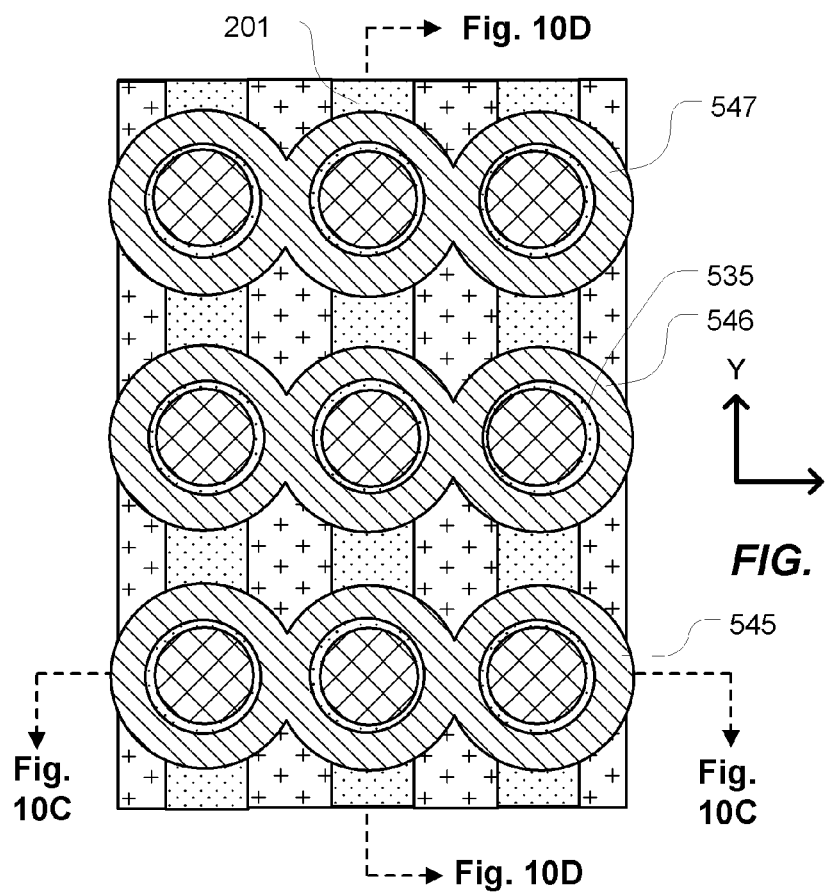

FIGS. 10A and 10B show perspective and layout views of the structure after the formation of thin film sidewall word line structures 545, 546, 547. The pillars include the source material 548 and sacrificial material 549, in this example, although other conditions of the pillars could exist at this stage. The gate dielectric material remains between the word line structures 545, 546, 547 and the channels. The thickness of the thin film sidewalls used to form the word line structures 545, 546, 547 is more than one half of the pitch P1 between the bit lines, and less than one half the pitch P2 between the rows of vertical transistors. As result, the thin film sidewalls merge in the row direction, and remain separated in the column direction. As a result of the rounded pillars, the word line structures 545, 546, 547 have a "wavy" shape between the rows.

Figure 10C:
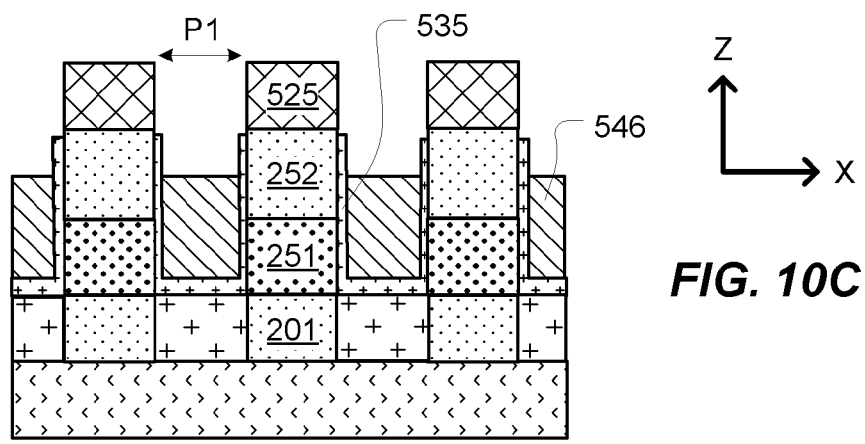
Figure 10D:
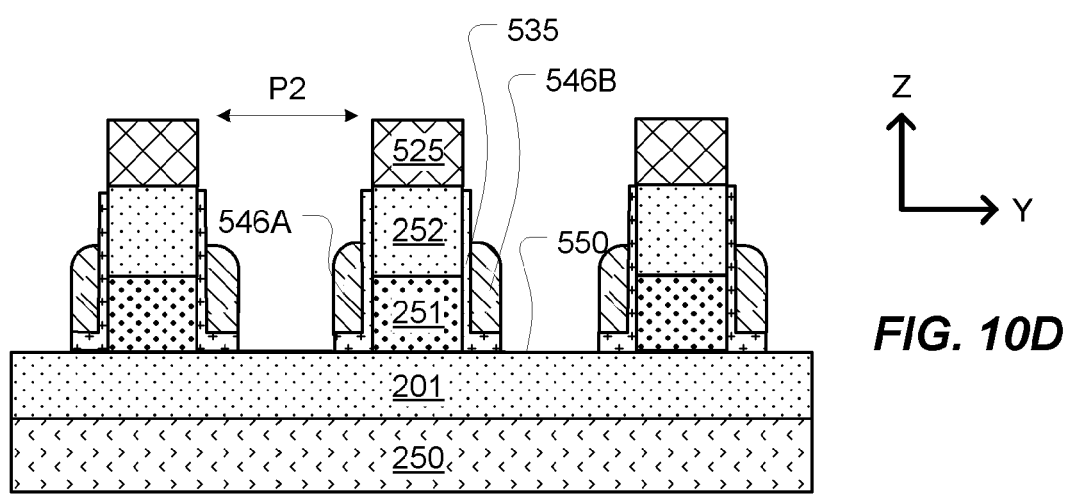

FIGS. 10C and 10D show a cross-section view in the X-Z plane and a cross-section view in the Y-Z plane, respectively, of the structure including the thin film sidewalls word line structures 545, 546, 547. FIG. 10C shows the merger of the thin film sidewalls in the row direction, forming the word line structure 546 because the thickness of the thin film sidewalls is greater than one half of the pitch P1 between the bit lines. The height of the word line structure 546 is sufficient to cover the element forming the channel 251 over the layer 535 of gate dielectric material. FIG. 10D shows that the thickness of the thin film sidewalls, labeled 546A and 546B in this figure, is less than one half of the pitch P2 between the word lines. Also as shown in FIG. 10D, the etch process used to define the word lines also removes the gate dielectric layer 535 exposing a surface 550 of the bit line 201. Although shown in this figure remaining on the top of the pillars, in some embodiments the gate dielectric material is also removed from the tops of the pillars.

As mentioned above, thin film sidewall word lines are formed by a blanket, conformal deposition of word line material over the pillars, followed by anisotropic etching down to a level exposing the tops of the bit lines 201. As a result of the anisotropic etching, the word line material is separated in the column dimension and merged in the row dimension to form word lines. In representative embodiments, the word line material can be a doped polysilicon, or other conductive material such as titanium nitride or other conductive nitride, tungsten, or other metal. Also, combinations of such materials can be used.

Figure 11A:
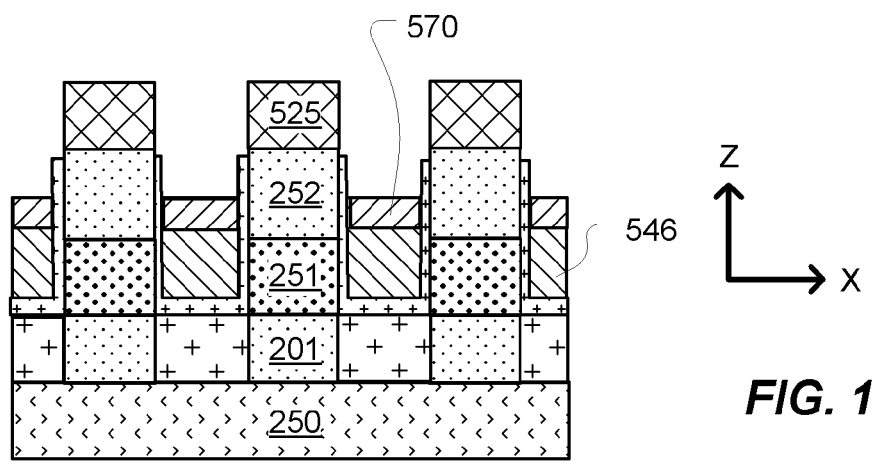
FIGS. 11A-11B illustrate a next stage in the process involving formation of silicide.
Figure 11B:
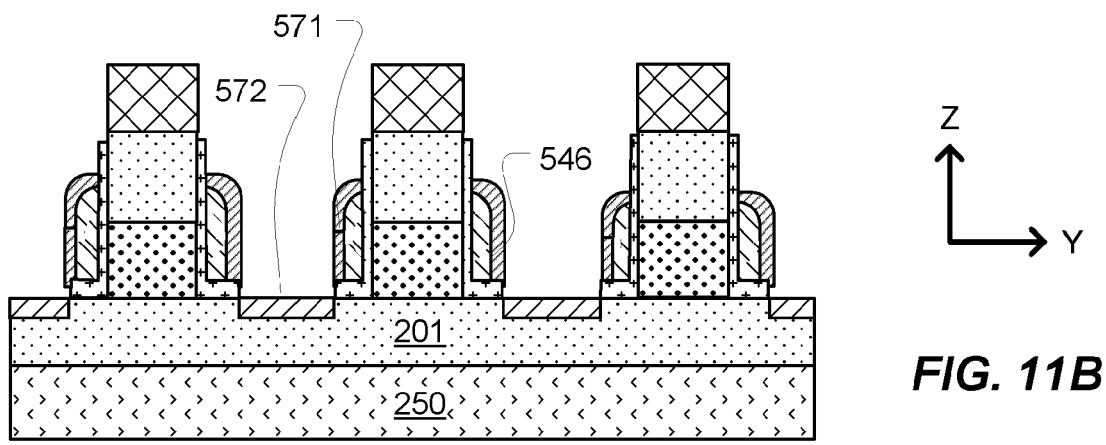
Figure 12:
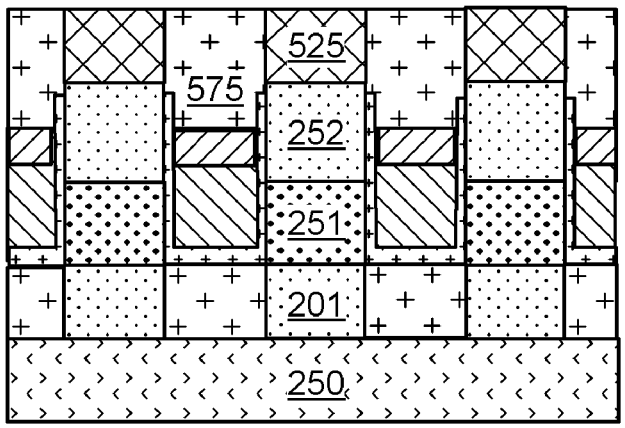

FIGS. 11A and 11B show a cross-section view in the X-Z plane and a cross-section view in the Y-Z plane, respectively, of the structure including the thin film sidewall word line structures, and bit lines after a process to form a silicide on the surfaces. This process can include depositing a silicide precursor material, such as tungsten, cobalt, titanium, nickel, tantalum or other acceptable material, and annealing the structure using a rapid thermal process for example to form silicides on exposed silicon surfaces, to improve the conductivity of the word lines and bit lines. It is understood that other silicides may also be formed in this manner by depositing titanium, arsenic, doped nickel, or alloys thereof, in a manner similar to the example described herein using cobalt.

Thus, as illustrated in FIG. 11A, a layer of silicide 570 is formed over the word line structure 546 between the pillars. Likewise as illustrated in FIG. 11B, a layer 571 of silicide is formed on top of the sides of the word line structures, and a layer of silicide 572 is formed on the exposed surfaces of the bit line 201. Although not shown in figure, silicide could also cover the sides of the word line structures.

Figure 13:
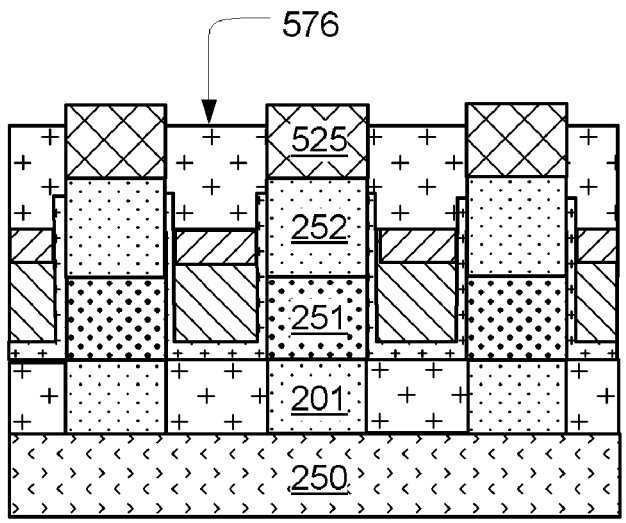
Figure 14:
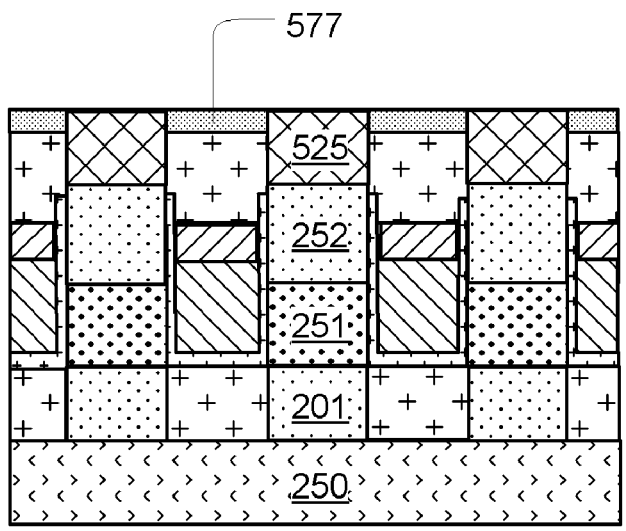

FIGS. 12 through 17 illustrate use of a keyhole transfer process that uses the via formed by removing the layer of sacrificial material 525, to form self-aligned openings for bottom electrode structures (e.g. bottom electrode 218 shown in FIGS. 2B-2C). Thus, after the silicide formation over the word lines and bit lines, a dielectric fill 575 is formed and planarized over the structure illustrated in FIG. 12. FIG. 13 shows the structure after an etch-back of the dielectric fill 575 to form recesses 576 in the dielectric fill surrounding the tops of the sacrificial material 525. FIG. 14 illustrates the structure after depositing a material, such as silicon or other material that can be selectively etched relative to the material of the dielectric fill 575, to fill the recesses, and then planarizing the structure. The resulting silicon elements create a mask layer 577 on the surface of the substrate with the tops of the pillars exposed.

In a next step as illustrated in FIG. 15, the caps of sacrificial material 525 are removed to form vias 578 that are self-aligned with the vertical transistors. Next, or as a continuation of the process removing the sacrificial material, an etch process is used to undercut the resulting openings in the mask layer 575 by a slight amount on the order of a few nanometers for example, creating overhangs 579. In addition, a silicide precursor is deposited and annealed to form a layer 590 of silicide on the surface of the source of the vertical transistor.

According to the keyhole transfer process, a layer 580 of etch mask material, such as silicon nitride or the like, is deposited in a conformal manner over the array area as shown in FIG. 16. As a result of the overhangs 579, the deposition results in the formation of voids (e.g. void 581) within the vias which are self-centered within the vias, and which have diameters that are a function of the width of the overhang 579.

As illustrated in FIG. 17, the resulting structure is etched anisotropically to form sidewalls 584 within the vias, and openings 585 within the sidewalls 584 which have diameters matching the diameters of the voids 581. The openings 585 expose the underlying silicide layer 590 on the source of the vertical transistor.

Figure 18A:
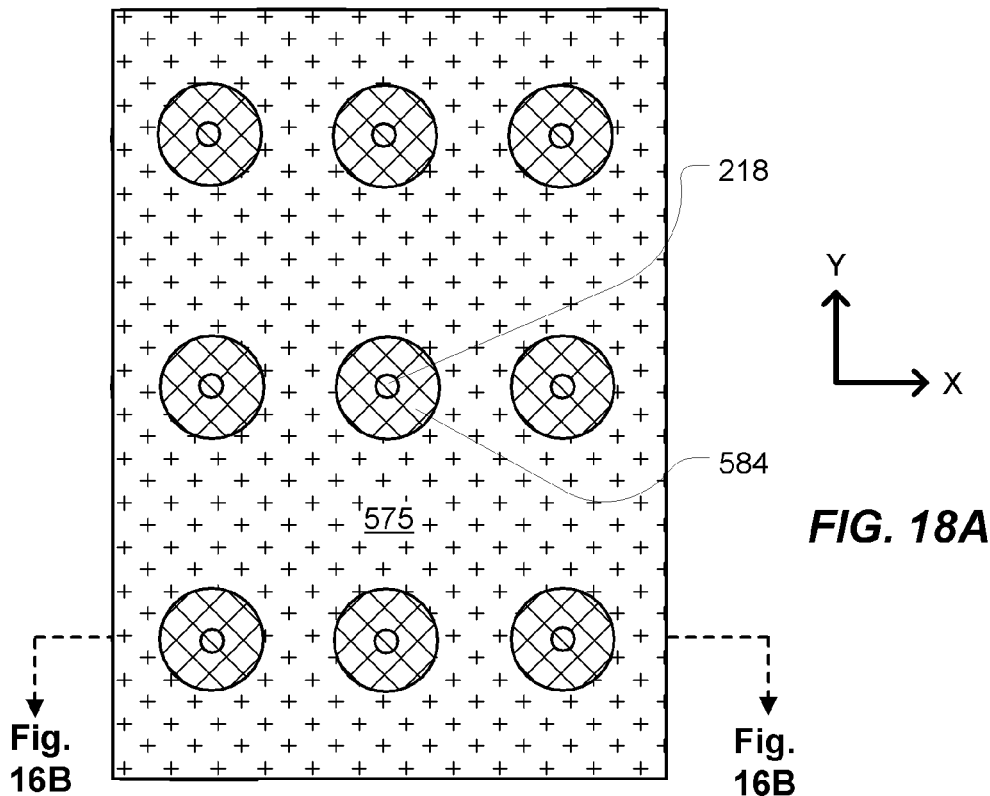
FIGS. 18A-18B illustrate layout and cross-section views of the structure after forming bottom electrode elements in the keyhole openings.
Figure 18B:
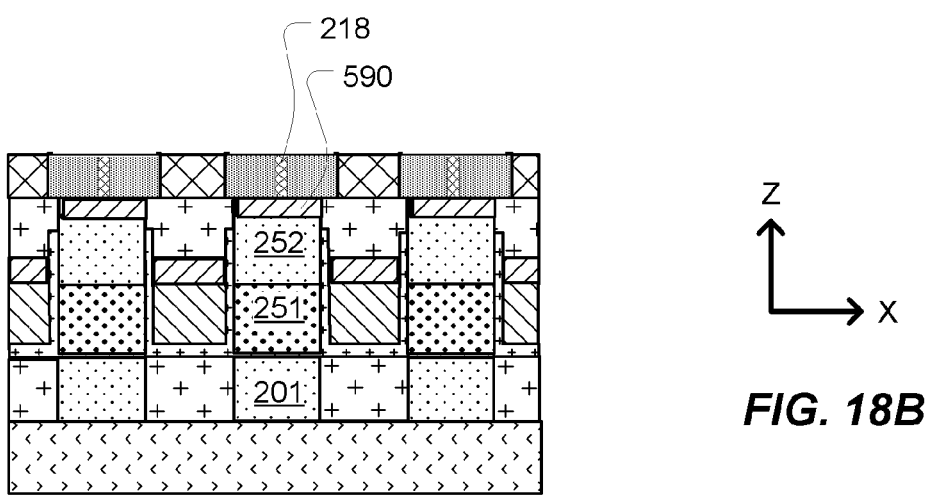

As illustrated in FIGS. 18A and 18B, in a following process, the etch mask layer 575 is removed and the structure is planarized. Then an electrode material is deposited to fill the openings and again the structure is planarized. The electrode material may comprise, for example, TiN or TaN. TiN may be preferred in embodiments in which memory material comprises GST (discussed in more detail below) because it makes good contact with GST, it is a common material used in semiconductor manufacturing, and it provides a good diffusion barrier at the higher temperatures at which GST transitions, typically in the 600-700° C. range. Alternatively, the electrode may comprise, for example, one or more elements from the group of Ti, W, Mo, Al, Ta, Cu, Pt, Ir, La, Ni, N, O, and Ru.

A layout view is illustrated in FIG. 18A, including dielectric fill 575 having surfaces of bottom electrodes 218 exposed within rings formed by the sidewalls 584. FIG. 18B shows the cross-section in the X-Z plane, of the resulting structure in which the bottom electrode 218 is self-centered, and self-aligned over a vertical transistor having a silicide cap 590, a source 252, a channel 251, and a drain in bit line 201.

Figure 19:
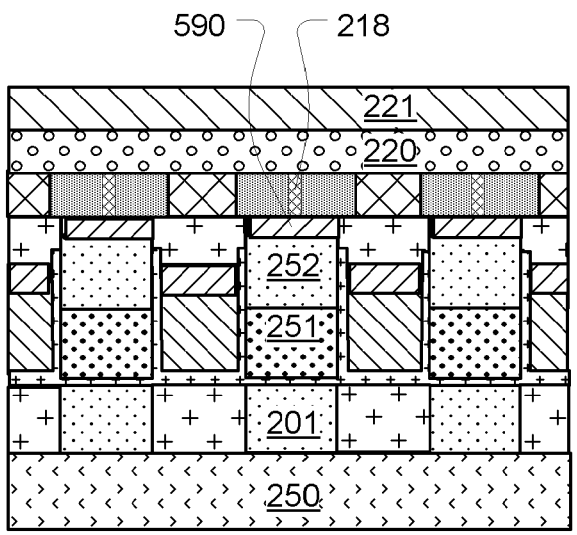
FIG. 19 illustrates formation of a memory element over the structure of FIGS. 18A-18B.

FIG. 19 illustrates the following steps used to complete the memory cell structure, including deposition of the layer 220 of phase change material and the deposition of the layer 221 of conductive material. Thus, FIG. 19 is similar to the structure shown in FIG. 2B.

The conductive material of the layer 221 on the programmable resistance memory material can be coupled to a common voltage. In embodiments the conductive material may comprise one or more conductive layers each comprising, for example, one or more elements from the group of Ti, W, Mo, Al, Ta, Cu, Pt, Ir, La, Ni, N, O, and Ru. Advantages of having at least two conductive layers include choosing the material of a first conductive layer for compatibility with the memory material, while material of a second conductive layer on the first conductive layer can be chosen for other advantages such as higher electrical conductivity than the first conductive layer. Back end of the line processing is then completed to form a finished integrated circuit.

In an alternative process, rather than using the keyhole transfer to form the bottom electrodes 218, a process can be used based on simply removing the sacrificial caps, and forming typical sidewall spacers within the resulting vias. A space within the sidewall spacers can be used for formation of the bottom electrode.

Figure 20:
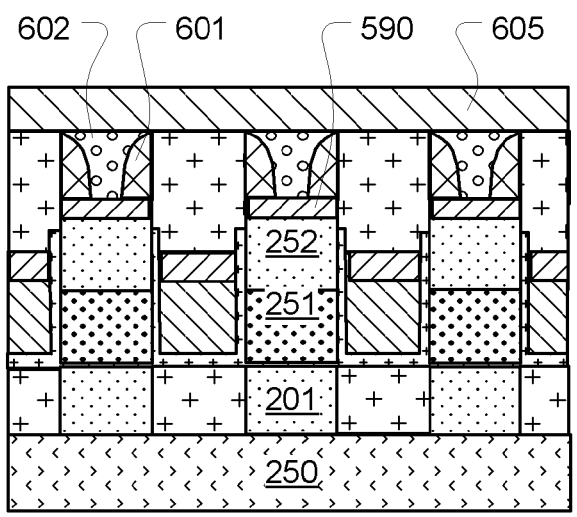
FIG. 20 illustrates an alternative memory element structure based on a pore type memory element.

FIG. 20 illustrates the results of an alternative process, where sidewall spacers 601 have been formed inside the vias left by removal of the sacrificial caps and over caps of silicide 590 on the vertical transistors. The spaces between the sidewall spacers 601 provide pores, which are filled with the phase change material 602 forming a pore-type memory element. A layer 605 of conductive material can be used to establish a ground plane. Alternatively, a bi-layer including a layer of phase change material and a layer of conductive material like that shown in FIG. 19 can be formed over the pore-type cell shown in FIG. 20.

Figure 21:
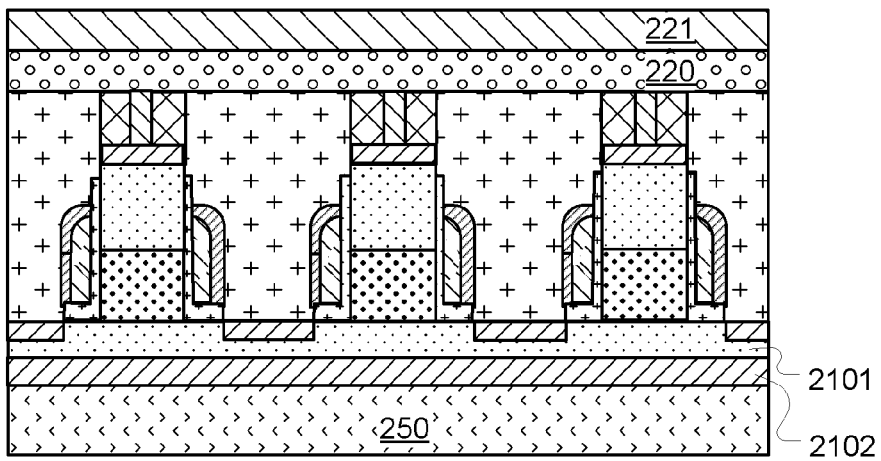
FIGS. 21-23 show a few alternative features that can be implemented in a structure as described herein.
Figure 22:
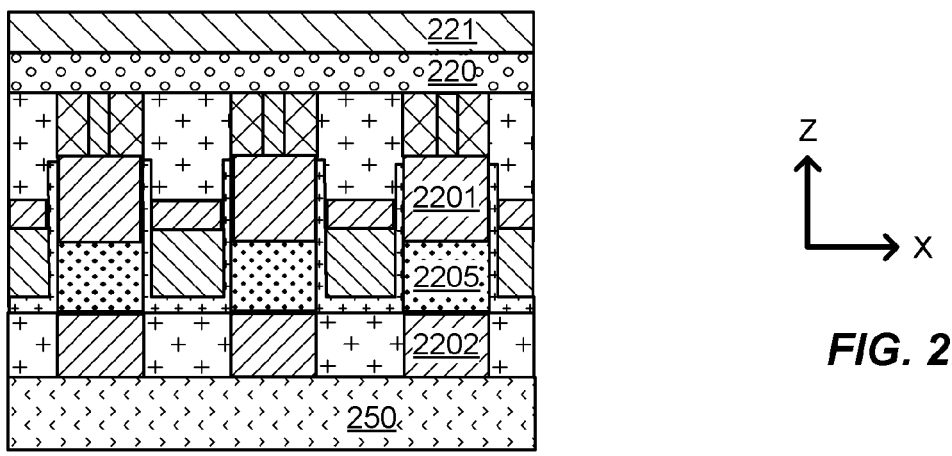
Figure 23:
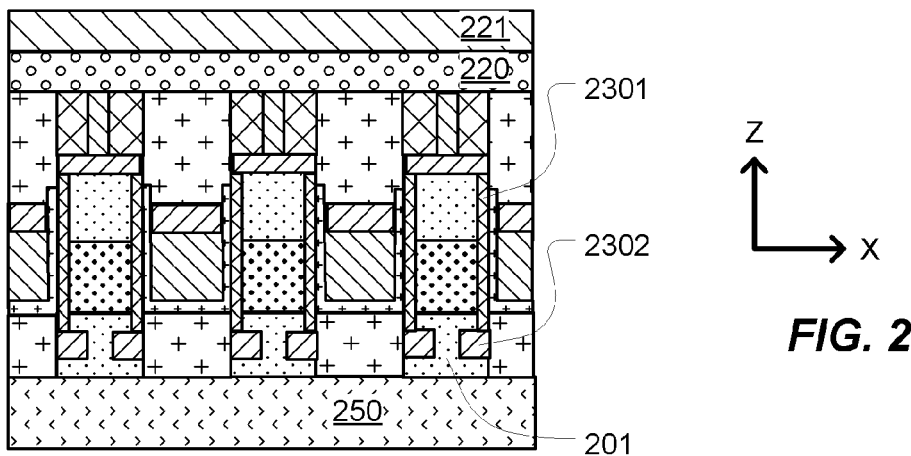

FIGS. 21 through 23 illustrate additional optional features that can be applied in structures described herein. For example, as shown in FIG. 21, the bit line 201 can replaced with a multilayer structure including a first conductive layer 2102 and a silicon layer 2101. This can be accomplished by forming a multilayer bit line material at the time of forming the multilayer stack described above.

FIG. 22 illustrates an alternative embodiment, in which both the bit line material and the source material are metal, or primarily metal. In this example, metal bit line 2202 and a metal source 2201 are used in the vertical transistors. The channel 2205 can be implemented using an intrinsic semiconductor material in this example.

FIG. 23 illustrates yet another alternative, in which a silicide process is applied to the sidewalls of the bit lines 201, to form silicide strips 2302 along the bit lines 201. This can be accomplished after patterning the trenches that define the bit lines along columns in the multilayer stack. The trenches are partially filled and a sidewall spacer such as nitride 2301 is formed down to the level of the partially filled trench. The material partially filling the trench is then removed, and a silicide precursor is deposited on the sides of the bit lines 201 in the exposed bottoms of the trenches. The structure is annealed to cause formation of silicide on the sidewalls of the bit lines 201. In alternatives, the silicide formed in this manner extends completely across the width of the bit line.

Figure 24:
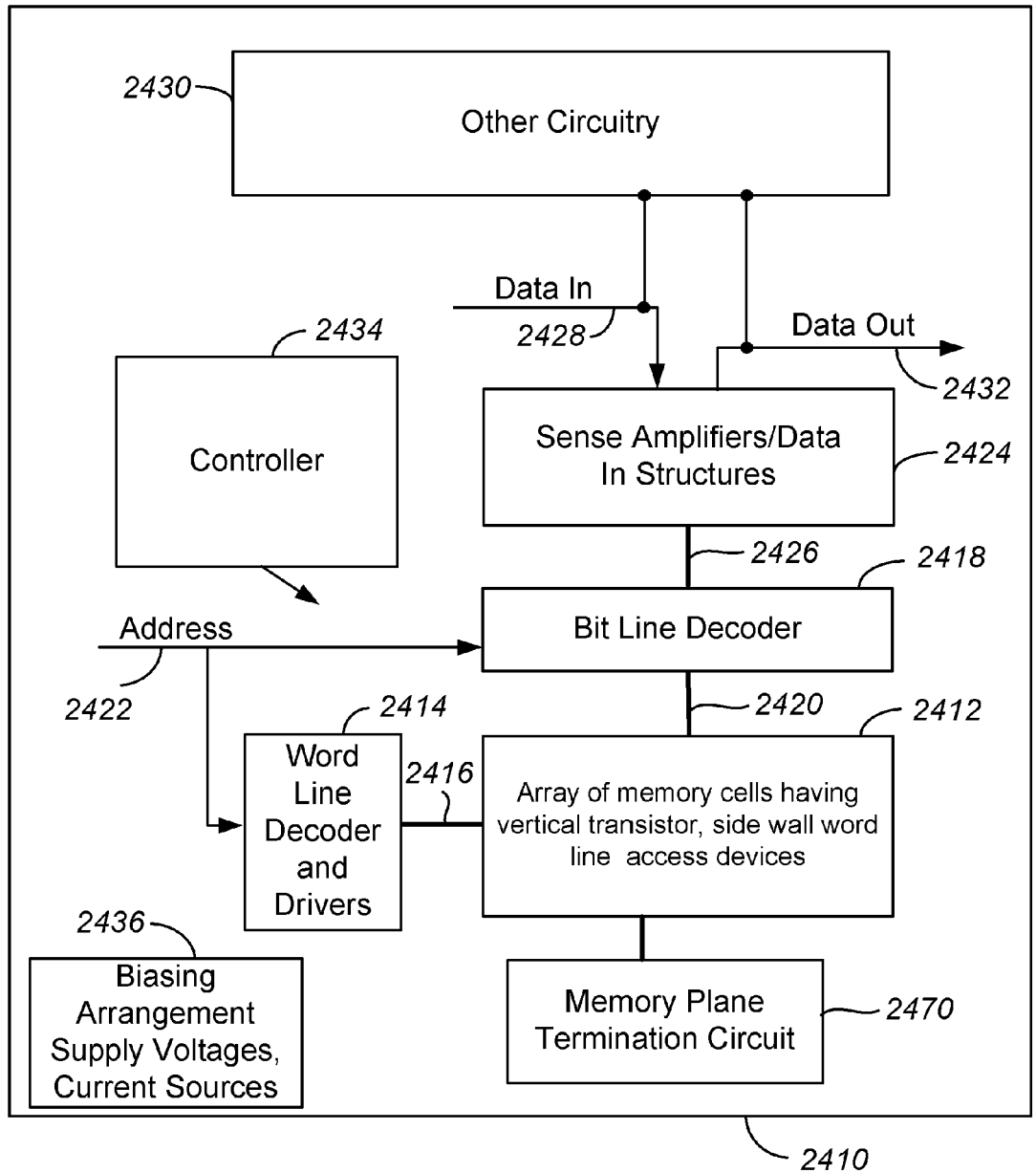
FIG. 24 is a simplified block diagram of an integrated circuit including a memory array implemented using memory cells having a thin film sidewall word line structures for vertical transistor access devices.

FIG. 24 is a simplified block diagram of an integrated circuit 2410 including a memory array 2412 implemented using memory cells having a memory plane overlying vertical channel field effect transistor access devices, with thin film sidewall word line structures as described herein. A memory plane termination circuit 2470 is coupled to the array and provides a common voltage to the memory plane of the array 2412. A word line decoder 2414 having read, set and reset modes is coupled to and in electrical communication with a plurality of word lines 2416 arranged along rows in the memory array 2412. A bit line (column) decoder 2418 is in electrical communication with a plurality of bit lines 2420 arranged along columns in the array 2412 for reading, setting, and resetting the phase change memory cells (not shown) in array 2412. Addresses are supplied on bus 2422 to word line decoder and drivers 2414 and bit line decoder 2418. Sense amplifiers and data-in structures in block 2424, including voltage and/or current sources for the read, set, and reset modes are coupled to bit line decoder 2418 via data bus 2426. Data is supplied via a data-in line 2428 from input/output ports on integrated circuit 2410, or from other data sources internal or external to integrated circuit 2410, to data-in structures in block 2424. Other circuitry 2430 may be included on integrated circuit 2410, such as a general purpose processor or special purpose application circuitry, or a combination of modules providing system-on-a-chip functionality supported by array 2412. Data is supplied via a data-out line 2432 from the sense amplifiers in block 2424 to input/output ports on integrated circuit 2410, or to other data destinations internal or external to integrated circuit 2410.

A controller 2434 implemented in this example using a bias arrangement state machine, controls the application of bias arrangement supply voltages and current sources 2436, such as read, program, erase, erase verify and program verify voltages and/or currents. Controller 2434 may be implemented using special-purpose logic circuitry as known in the art. In alternative embodiments, controller 2434 comprises a general-purpose processor, which may be implemented on the same integrated circuit to execute a computer program to control the operations of the device. In yet other embodiments, a combination of special-purpose logic circuitry and a general-purpose processor may be utilized for implementation of controller 2434.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory device comprising:
   a plurality of bit lines;
   an array of vertical transistors arranged on the plurality of bit lines, each vertical transistor in the array having a first terminal in contact with or in one of the plurality of bit lines, a channel or base, and a second terminal over the first terminal;
   a plurality of self-aligned word lines along rows of vertical transistors in the array; and
   memory elements in electrical communication with the second terminals of respective vertical transistors in the array.

2. The device of claim 1, wherein the vertical transistors in a row are separated from one another by a first distance, and the vertical transistors in a column along a given bit line in the plurality of bit lines separated from one another by a second distance greater than the first distance, and the self-aligned word lines comprise thin film sidewalls on the vertical transistors having a thickness more than one half the first distance and less than one half the second distance, whereby the thin film sidewalls merge in the row direction to form the word lines, and do not contact adjacent thin film sidewalls in the column direction.

3. The device of claim 1, wherein the plurality of vertical transistors comprise field effect transistors and include gate dielectric layers between the respective channels and word lines.

4. The device of claim 1, wherein the memory elements comprise elements in a memory plane comprising a blanket of programmable resistance memory material electrically coupled to respective second terminals of the field effect transistors, and including:
   conductive material on the film of programmable resistance memory material and coupled to a common voltage.

5. The device of claim 1, wherein the plurality of bit lines comprises ridges of bit line material separated by an insulator.

6. The device of claim 1, wherein the plurality of bit lines comprises ridges of bit line material having tops and opposing sides, and the bases or channels and the second terminals of vertical transistors in the array are self-aligned with the opposing sides of the tops of the ridges.

7. The device of claim 1, wherein the plurality of bit lines comprise ridges of bit line material having tops and opposing sides, and the base or channel and the second terminal of a vertical transistor in the array are self-aligned with the opposing sides of the tops of the ridges; and
   wherein the second terminals of the vertical transistors in the array have top contact surfaces having perimeters, and including electrodes contacting the contact surfaces, and aligned with, or within a space defined by, the perimeters of the contact surfaces.

8. The device of claim 1, including a dielectric layer over the second terminals of the vertical transistors in the array, and wherein the plurality of bit lines comprise ridges of bit line material having tops and opposing sides, and the base or channel and the second terminal of a vertical transistor in the array are self-aligned with the opposing sides of the tops of the ridges; and wherein the second terminals of the vertical transistors in the array have a top contact surface having perimeters, and including pores in the dielectric layer exposing the contact surfaces, and aligned with, or within a space defined by, the perimeters of the contact surfaces; and where the memory elements comprise programmable resistance material in the pores.

9. The device of claim 1, further comprising a plurality of electrodes electrically coupled to corresponding memory elements, and self-aligned with corresponding second terminals of the vertical transistors.

10. The device of claim 1, further wherein the second terminals have conductive caps comprising silicide, and including a dielectric layer over the second terminals of the field effect transistors, and plurality of electrodes extending vias through the dielectric layer to the conductive caps, the vias being self-aligned with the second terminals of the vertical transistors.

11. The device of claim 1, including a dielectric layer over the second terminals of the field effect transistors, wherein the memory elements comprise programmable resistance memory material extending through openings in the dielectric layer to respective second terminals of the vertical transistors.

12. The device of claim 1, wherein the channel or base, and the second terminal have a cylindrical shape.

13. The device of claim 1, wherein the plurality of word lines comprise thin film sidewalls conformal with the plurality of vertical transistors.

14. A memory device comprising:
a plurality of bit lines;
an array of vertical transistors self-aligned with the plurality of bit lines;
a plurality of word lines self-aligned with the vertical transistors in the array; and
memory elements in electrical communication with respective vertical transistors in the array, and including contact surfaces on the memory elements self-aligned with the vertical transistors in the array.

15. A method for manufacturing a memory device, the method comprising:
forming a plurality of bit lines;
forming an array of vertical transistors self-aligned on the plurality of bit lines, each vertical transistor in the array having a first terminal in contact with or in one of the plurality of bit lines, a channel or base, and a second terminal over the first terminal;
forming word lines self-aligned on the vertical transistors; and
forming memory elements self-aligned and in electrical communication with the second terminal of respective vertical transistors in the array.

16. The method of claim 15, wherein said forming word lines includes forming thin film sidewalls of word line material on the vertical transistors.

17. The method of claim 16, wherein said forming thin film sidewalls includes
depositing a layer of the word line material over the pillars; and
anisotropically etching the layer of the word line material.

18. The method of claim 16, wherein the vertical transistors in a row are separated from one another by a first distance, and the vertical transistors in a column along a given bit line in the plurality of bit lines are separated from one another by a second distance greater than the first distance, and the thin film sidewalls have a thickness more than one half the first distance and less than one half the second distance.

19. The method of claim 15, wherein said forming a plurality of bit lines and said forming an array of vertical transistors include:
providing a substrate including a conductive material layer adapted to act as a bit line material and a transistor terminal material;
forming a semiconductor material layer on the bit line material layer adapted to act as material for a base or channel;
forming a second terminal material layer on the semiconductor material layer; and
etching first trenches extending through the conductive, semiconductor and second terminal material layers to define bit lines in the conductive material layer; and
etching second trenches extending through the semiconductor layer arranged orthogonally to the bit lines, whereby pillars remain on the bit lines, the pillars including the channels or bases and second terminals of corresponding vertical transistors.

20. The method of claim 19, including before etching the second trenches, filling the first trenches with a fill material and planarizing a surface of the fill material.

21. The method of claim 19, including using a double or manifold patterning process to define at least one of the first trenches and second trenches.

22. The method of claim 19, including rounding edges of the pillars.

23. The method of claim 15, wherein said forming a plurality of bit lines and said forming an array of vertical transistors include:
providing a substrate including a conductive material layer adapted to act as a bit line material and a transistor terminal material;
forming a semiconductor material layer on the bit line material layer adapted to act as material for a base or channel;
forming a second terminal material layer on the semiconductor material layer;
forming a sacrificial layer on the second terminal material layer;
etching first trenches extending through the conductive layer to define bit lines; and
etching second trenches extending through semiconductor layer arranged orthogonally to the bit lines, whereby pillars remain on the bit lines, the pillars including the channels or bases and second terminals of corresponding vertical transistors, and a cap of sacrificial material.

24. The method of claim 23; wherein said forming word lines includes
depositing a layer of word line material over the pillars; and
anisotropically etching the layer of word line material; and
further including:
depositing a fill material over the word lines;
removing the caps of sacrificial material to form vias aligned with the pillars;
forming electrodes within the aligned vias; and
wherein said memory elements contact the electrodes.

25. The method of claim 23, wherein said forming word lines includes
depositing a layer of word line material over the pillars; and
anisotropically etching the layer of word line material; and further including:
depositing a fill material over the word lines;
removing the caps of sacrificial material to form vias aligned with the pillars;
forming pores within the aligned vias; and
wherein said memory elements extend into the pores to contact the second terminals of the vertical transistors.

26. The method of claim 23, including using a double or manifold patterning process to define at least one of the first trenches and second trenches.

27. The method of claim 23, including rounding edges of the pillars.

28. The method of claim 15, further comprising forming a conductive cap comprising silicide on the second terminals of the vertical transistors.

29. The method of claim 15, further comprising forming a silicide on the word lines.

30. The method of claim 15, wherein forming the memory elements comprises:
forming a blanket layer of the programmable resistance memory material; and
forming a blanket layer of the conductive material on the blanket layer of the programmable resistance memory material, and wherein the memory elements include portions of the blanket layer of the programmable resistance memory material in contact with corresponding vertical transistors.

* * * * *